(12) United States Patent
Kim

(10) Patent No.: US 7,817,470 B2
(45) Date of Patent: Oct. 19, 2010

(54) NON-VOLATILE MEMORY SERIAL CORE ARCHITECTURE

(75) Inventor: Jin-Ki Kim, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 326 days.

(21) Appl. No.: 11/944,535

(22) Filed: Nov. 23, 2007

(65) Prior Publication Data

US 2008/0123423 A1    May 29, 2008

Related U.S. Application Data

(60) Provisional application No. 60/867,269, filed on Nov. 27, 2006.

(51) Int. Cl.
G11C 11/34 (2006.01)
G11C 16/04 (2006.01)

(52) U.S. Cl. .................... 365/185.11; 365/219

(58) Field of Classification Search ........ 365/185.11 O, 365/185.18, 185.33, 219 X, 220, 221, 185.11, 365/219
See application file for complete search history.

(56) References Cited

U.S. PATENT DOCUMENTS

| 4,174,536 A | 11/1979 | Misunas et al. |
| 4,733,376 A | 3/1988 | Ogawa |
| 4,796,231 A | 1/1989 | Pinkham |
| 4,800,530 A | 1/1989 | Itoh et al. |
| 5,126,808 A | 6/1992 | Montalvo et al. |
| 5,136,292 A | 8/1992 | Ishida |
| 5,175,819 A | 12/1992 | Le Ngoc et al. |
| 5,243,703 A | 9/1993 | Farmwald et al. |
| 5,280,539 A | 1/1994 | Yeom et al. |
| 5,319,598 A | 6/1994 | Aralis et al. |
| 5,365,484 A | 11/1994 | Cleveland et al. |
| 5,404,460 A | 4/1995 | Thomsen et al. |

(Continued)

FOREIGN PATENT DOCUMENTS

WO    01/06941 A2    9/2001

OTHER PUBLICATIONS

PCT Patent Application No. PCT/CA2007/002125 International Search Report dated Mar. 14, 2008.

(Continued)

*Primary Examiner*—VanThu Nguyen
(74) *Attorney, Agent, or Firm*—Shin Hung; Border Ladner Gervais LLP

(57) ABSTRACT

A memory system having a serial data interface and a serial data path core for receiving data from and for providing data to at least one memory bank as a serial bitstream. The memory bank is divided into two halves, where each half is divided into upper and lower sectors. Each sector provides data in parallel to a shared two-dimensional page buffer with an integrated self column decoding circuit. A serial to parallel data converter within the memory bank couples the parallel data from either half to the serial data path core. The shared two-dimensional page buffer with the integrated self column decoding circuit minimizes circuit and chip area overhead for each bank, and the serial data path core reduces chip area typically used for routing wide data buses. Therefore a multiple memory bank system is implemented without a significant corresponding chip area increase when compared to a single memory bank system having the same density.

28 Claims, 19 Drawing Sheets

U.S. PATENT DOCUMENTS

| | | |
|---|---|---|
| 5,430,859 A | 7/1995 | Norman et al. |
| 5,440,694 A | 8/1995 | Nakajima |
| 5,452,259 A | 9/1995 | McLaury |
| 5,473,563 A | 12/1995 | Suh et al. |
| 5,473,566 A | 12/1995 | Rao |
| 5,473,577 A | 12/1995 | Miyake et al. |
| 5,596,724 A | 1/1997 | Mullins et al. |
| 5,602,780 A | 2/1997 | Diem et al. |
| 5,636,342 A | 6/1997 | Jeffries |
| 5,671,178 A | 9/1997 | Park et al. |
| 5,721,840 A | 2/1998 | Soga |
| 5,740,379 A | 4/1998 | Hartwig |
| 5,761,146 A | 6/1998 | Yoo et al. |
| 5,771,199 A | 6/1998 | Lee |
| 5,802,006 A | 9/1998 | Ohta |
| 5,806,070 A | 9/1998 | Norman et al. |
| 5,818,785 A | 10/1998 | Ohshima |
| 5,828,899 A | 10/1998 | Richard et al. |
| 5,835,935 A | 11/1998 | Estakhri et al. |
| 5,859,809 A | 1/1999 | Kim |
| 5,872,994 A | 2/1999 | Akiyama et al. |
| 5,937,425 A | 8/1999 | Ban |
| 5,941,974 A | 8/1999 | Babin |
| 5,959,930 A | 9/1999 | Sakurai |
| 5,995,417 A | 11/1999 | Chen et al. |
| 6,002,638 A | 12/1999 | John |
| 6,085,290 A | 7/2000 | Smith et al. |
| 6,091,660 A | 7/2000 | Sasaki et al. |
| 6,107,658 A | 8/2000 | Itoh et al. |
| 6,144,576 A | 11/2000 | Leddige et al. |
| 6,148,364 A | 11/2000 | Srinivasan et al. |
| 6,178,135 B1 | 1/2001 | Kang |
| 6,304,921 B1 | 10/2001 | Rooke |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,438,064 B2 | 8/2002 | Ooishi |
| 6,442,098 B1 | 8/2002 | Kengeri |
| 6,535,948 B1 | 3/2003 | Wheeler et al. |
| 6,584,303 B1 | 6/2003 | Kingswood et al. |
| 6,594,183 B1 | 7/2003 | Lofgren et al. |
| 6,601,199 B1 | 7/2003 | Fukuda et al. |
| 6,611,466 B2 | 8/2003 | Lee et al. |
| 6,658,509 B1 | 12/2003 | Bonella et al. |
| 6,658,582 B1 | 12/2003 | Han |
| 6,680,904 B1 | 1/2004 | Kaplan et al. |
| 6,715,044 B2 | 3/2004 | Lofgren et al. |
| 6,718,432 B1 | 4/2004 | Srinivasan |
| 6,732,221 B2 | 5/2004 | Ban |
| 6,754,807 B1 | 6/2004 | Parthasarathy et al. |
| 6,763,426 B1 | 7/2004 | James et al. |
| 6,799,246 B1 | 9/2004 | Wise et al. |
| 6,807,103 B2 | 10/2004 | Cavaleri et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,928,501 B2 | 8/2005 | Andreas et al. |
| 6,944,697 B2 | 9/2005 | Andreas |
| 6,950,325 B1 | 9/2005 | Chen |
| 6,967,874 B2 | 11/2005 | Hosono |
| 6,996,644 B2 | 2/2006 | Schoch et al. |
| 7,032,039 B2 | 4/2006 | DeCaro |
| 7,073,022 B2 | 7/2006 | El-Batal et al. |
| 7,515,471 B2 * | 4/2009 | Oh et al. ............ 365/185.11 |
| 2002/0188781 A1 | 12/2002 | Schoch et al. |
| 2003/0074505 A1 | 4/2003 | Andreas et al. |
| 2003/0128702 A1 | 7/2003 | Satoh et al. |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0199721 A1 | 10/2004 | Chen |
| 2004/0230738 A1 | 11/2004 | Lim et al. |
| 2005/0160218 A1 | 7/2005 | See et al. |
| 2005/0213421 A1 | 9/2005 | Polizzi et al. |
| 2006/0023549 A1 | 2/2006 | Son et al. |
| 2006/0050594 A1 | 3/2006 | Park |
| 2006/0152979 A1 | 7/2006 | Toda et al. |

OTHER PUBLICATIONS

"A 90-nm CMOS 1.8-V 2-Gb NAND Flash Memory forMass Storage Applications", June Lee et al., IEEE Journal of Solid-State Circuits, vol. 38, No. 11, Nov. 2003.

Toshiba TH58NVG1S3AFT05Data sheet, May 19, 2003.

Samsung K9K4G08U1MData sheet, Sep.19, 2001.

Amtel Corp., "High Speed Small Sectored SPI Flash Memory", pp. 1-22, 2006.

64 Megabit CMOS 3.0 Volt Flash Memory with 50MHz SPI, Spansion, pp. 1-22 (2006).

King, et al., "Communicating with Daisy Chained MCP42XXX Digital Potentiometers", Microchip AN747, pp. 1-8, 2001.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, OneNAND4G(KFW4G16Q2M-DEB6), OneNAND2G(KFH2G16Q2M-DEB6), OneNAND1G (KFW1G16Q2M-DEB6) Flash Memory, OneNAND™ Specification Ver. 1.2, pp. 1-125, Dec. 23, 2005.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, ( Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0-8186-2655-0-92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/ Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics, "DDR2 Fully Buffered DIMM 240pin FBDIMMS based on 512Mb C-die" Rev. 1.3, Sep. 2006, pp. 1-32, Sep. 2006.

"HyperTransport TM I/O Link Specification", Revision 3.00, Document No. HTC20051222-0046-0008, Hypertransport Technology Consortium, pp. 1-428, Apr. 2006.

"8-megabit 2.5-volt Only or 2.7-volt Only DataFlash®," Technical Specification, Atmel, Rev. 2225H-DFLSH (2004).

"1024K12C™ CMOS Serial EEPROM," Technical Specification, Microchip Technology Inc., (2006).

"The I2C-Bus Specification," Version 2.1, Philips Semiconductors, Jan. 2000.

"16 Mbit LPC Serial Flash," Preliminary Specification, Silicon Storage Technology Inc., (2006).

"16 Mbit SPI Serial Flash," Preliminary Specification, Silicon Storage Technology Inc., (2005).

"2Mbit, Low Voltage, Serial Flash Memory with 40 Mhz SPI Bus Interface," Technical Specification, STMicroelectronics Group of Companies (2005).

"NAND Flash Applications Design Guide," Revision 1.0, Toshiba America Electronics Components, Inc., (Apr. 2003).

* cited by examiner

NON-VOLATILE MEMORY SERIAL CORE ARCHITECTURE

CROSS REFERENCE TO RELATED APPLICATIONS

This application claims the benefit of priority of U.S. Provisional Patent Application No. 60/867,269, filed on Nov. 27, 2006, the content of which is incorporated herein by reference in its entirety.

BACKGROUND

Mobile electronic devices, such as, for example, digital cameras, portable digital assistants, portable audio/video players and mobile terminals continue to require mass storage memory, preferably non-volatile memory with ever increasing capacities and speed capabilities. For example, presently available audio players can have between 256 Mbytes to 40 Gigabytes of memory for storing audio/video data. Non-volatile memory, for example, such as Flash memory and hard-disk drives are preferred since data is retained in the absence of power, thus extending battery life.

Presently, hard disk drives have high densities and can store 40 to 160 Gigabytes of data, but are relatively bulky. However, Flash memory, also known as a solid-state drive, is popular because of their high density, non-volatility, and small size relative to hard disk drives. The advent of multi-level cells (MLC) further increases the Flash memory density for a given area relative to single level cells. Those of skill in the art will understand that Flash memory can be configured as NOR Flash, NAND Flash or any other type of Flash memory configuration. NAND Flash has higher density per given area due to its more compact memory array structure. For the purposes of further discussion, references to Flash memory should be understood as being any type of Flash devices, such as, for example, NOR and NAND type Flash memory.

While existing Flash memory modules operate at speeds sufficient for many current consumer electronic devices, such memory modules likely will not be adequate for use in future devices where high data rates are desired. For example, a mobile multimedia device that records high definition moving pictures is likely to require a memory module with a programming throughput of at least 10 MB/s, which is not obtainable with current Flash memory technology with typical programming data rates of 7 MB/s. Multi-level cell Flash has a much slower rate of 1.5 MB/s due to the multi-step programming sequence required to program the cells.

The problem with many standard memory devices lies in their use of a parallel data interface for receiving and providing data. For example, some memory devices provide 8, 16 or 32 bits of data in parallel at an operating frequency of up to 30 MHz. Standard parallel data interfaces providing multiple bits of data in parallel are known to suffer from well known communication degrading effects such as cross-talk, signal skew and signal attenuation, for example, which degrades signal quality, when operated beyond their rated operating frequency. In order to increase data throughput, a memory device having a serial data interface has been disclosed in commonly owned U.S. Patent Publication No. 20070076479, which receives and provides data serially at a frequency, for example, 200 MHz. The memory device described in U.S. Patent Publication No. 20070076479 can be used in a system of memory devices that are serially connected to each other, as described in commonly owned U.S. Provisional Patent Application No. 60/902,003 filed Feb. 16, 2007, the content of which is incorporated herein by reference in its entirety.

FIG. 1A shows a system of a plurality of memory devices that are serially connected to each other, as described in U.S. Patent Publication No. 20070076479. Referring to FIG. 1A, a serial interconnection 5 includes a plurality of memory devices that are connected in series with a memory controller. The memory controller includes a system interface for receiving system commands and data from the system in which the serial interconnection is integrated, and provides read data to the system. In particular, Device 0 is comprised of a plurality of data input ports (SIP0, SIP1), a plurality of data output ports (SOP0, SOP1), a plurality of control input ports (IPE0, IPE1), and a plurality of control output ports (OPE0, OPE1). These data and control signals are sent to the memory device 5 from the memory controller. A second memory device (Device 1) is comprised of the same types of ports as Device 0. Device 1 is interconnected to Device 0. For example, Device 1 can receive data and control signals from Device 0. One or more additional devices may also be interconnected alongside Device 0 and Device 1 in a similar manner. A last device (e.g., Device 3) in the series-connection provides data and control signals back to the memory controller after a predetermined latency. Each memory device (e.g., device 0, 1, 2, 3) outputs an echo (IPEQ0, IPEQ1, OPEQ0, OPEQ1) of IPE0, IPE1, OPE0, and OPE1 (i.e., control output ports) to the subsequent device. The signals can be passed from one device to a subsequent series-connected device. A single clock signal is provided to each of the plurality of series-connected memory devices.

FIG. 1B is a block diagram illustrating the core architecture of one of the memory devices shown in FIG. 1A. Memory device 10 includes a multiplicity of identical memory banks with their respective data, control and addressing circuits, such as memory bank A 12 and memory bank B 14, an address and data path switch circuit 16 connected to both memory banks 12 and 14, and identical interface circuits 18 and 20, associated with each memory bank for providing data to and for receiving data from the switch circuit 16. Memory banks 12 and 14 are preferably non-volatile memory, such as Flash memory, for example. Logically, the signals received and provided by memory bank 12 are designated with the letter "A", while the signals received and provided by memory bank 14 are designated with the letter "B". Similarly, the signals received and provided by interface circuit 18 are designated with the number "0", while the signals received and provided by interface circuit 20 are designated with the number "1". Each of the interface circuits 18 and 20 receives access data in a serial data stream, where the access data can include a command, address information and input data for programming operations, for example. In a read operation, each of the interface circuits provides output data as a serial data stream in response to a read command and address data. The memory device 10 further includes global circuits, such as a control interface 22 and status/ID register circuit 24, which provide global signals such as clock signal sclki and reset to the circuits of both memory banks 12 and 14 and the respective interface circuits 18 and 20. A further discussion of the aforementioned circuits now follows.

Memory bank 12 includes well known memory peripheral circuits such as sense amplifier and page buffer circuit block 26 for providing output data DOUT_A and for receiving input program data DIN_A, and row decoder block 28. Those of skill in the art will understand that block 26 also includes column decoder circuits. A control and predecoder circuit block 30 receives address signals and control signals via signal line ADDR_A, and provides predecoded address signals to the row decoders 28 and the sense amplifier and page buffer circuit block 26.

The peripheral circuits for memory bank 14 are identical to those previously described for memory bank 12. The circuits of memory bank B include a sense amplifier and page buffer circuit block 32 for providing output data DOUT_B and for receiving input program data DIN_B, a row decoder block 34, and a control and predecoder circuit block 36. Control and predecoder circuit block 36 receives address signals and control signals via signal line ADDR_B, and provides predecoded address signals to the row decoders 34 and the sense amplifier and page buffer circuit block 36. Each memory bank and its corresponding peripheral circuits can be configured with well known architectures.

In general operation, each memory bank is responsive to a specific command and address, and if necessary, input data. For example, memory bank 12 provides output data DOUT_A in response to a read command and a read address, and can program input data in response to a program command and a program address. Each memory bank can be responsive to other commands such as an erase command, for example.

In the example shown in FIG. 1B, path switch 16 is a dual port circuit which can operate in one of two modes for passing signals between the memory banks 12 and 14, and the interface circuits 18 and 20. First is a direct transfer mode where the signals of memory bank 12 and interface circuit 18 are passed to each other. Concurrently, the signals of memory bank 14 and interface circuit 20 are passed to each other in the direct transfer mode. Second is a cross-transfer mode where the signals of memory bank 12 and interface circuit 20 are passed to each other. At the same time, the signals of memory bank 14 and interface circuit 18 are passed to each other. A single port configuration of path switch 16 will be discussed later.

As previously mentioned, interface circuits 18 and 20 receive and provide data as serial data streams. This is for reducing the pin-out requirements of the chip as well as to increase the overall signal throughput at high operating frequencies. Since the circuits of memory banks 12 and 14 are typically configured for parallel address and data, converting circuits are required.

Interface circuit 18 includes a serial data link 40, input serial to parallel register 42, and output parallel to serial register 44. Serial data link 40 receives serial input data SIP0, an input enable signal IPE0 and an output enable signal OPE0, and provides serial output data SOP0, input enable echo signal IPEQ0 and output enable echo signal OPEQ0. Signal SIP0 (and SIP1) is a serial data stream which can each include address, command and input data. Serial data link 40 provides buffered serial input data SER_IN0 corresponding to SIP0 and receives serial output data SER_OUT0 from output parallel to serial register 44. The input serial-to-parallel register 42 receives SER_IN0 and converts it into a parallel set of signals PAR_IN0. The output parallel-to-serial register 44 receives a parallel set of output data PAR_OUT0 and converts it into the serial output data SER_OUT0, which is subsequently provided as data stream SOP0. Output parallel-to-serial register 44 can also receive data from status/ID register 24 for outputting the data stored therein instead of the PAR_OUT0 data. Further details of this particular feature will be discussed later. Furthermore, serial data link 40 is configured to accommodate daisy chain cascading of the control signals and data signals with another memory device 10.

Serial interface circuit 20 is identically configured to interface circuit 18, and includes a serial data link 46, input serial-to-parallel register 48, and output parallel-to-serial register 50. Serial data link 46 receives serial input data SIP1, an input enable signal IPE1 and an output enable signal OPE1, and provides serial output data SOP1, input enable echo signal IPEQ1 and output enable echo signal OPEQ1. Serial data link 46 provides buffered serial input data SER_IN1 corresponding to SIP1 and receives serial output data SER_OUT1 from output parallel-to-serial register 50. The input serial-to-parallel register 50 receives SER_IN1 and converts it into a parallel set of signals PAR_IN1. The output parallel-to-serial register 48 receives a parallel set of output data PAR_OUT1 and converts it into the serial output data SER_OUT1, which is subsequently provided as data stream SOP1. Output parallel to serial register 48 can also receive data from status/ID register 24 for outputting the data stored therein instead of the PAR_OUT1 data. As with serial data link 40, serial data link 46 is configured to accommodate daisy chain cascading of the control signals and data signals with another memory device 10.

Control interface 22 includes standard input buffer circuits, and generates internal chip select signal chip_sel, internal clock signal sclki, and internal reset signal reset, corresponding to chip select (CS#), serial clock (SCLK) and reset (RST#), respectively. While signal chip_sel is used primarily by serial data links 40 and 46, reset and sclki are used by many of the circuits throughout memory device 10.

While the serial data interface provides performance advantages over parallel data interface architectures, these advantages can be offset by performance degradations in memory banks 12 and 14. More specifically, the push for increased memory density will adversely affect how quickly data can be sensed from the memory cells, especially NAND configured Flash memory cells. To illustrate this problem, a portion of a NAND configured Flash memory array of FIG. 1B is shown in FIG. 2.

Referring to FIGS. 1B and 2, memory bank 12 includes i sets of bitlines, where i is an integer number greater than 0, and each set includes an even bitline and an odd bitline. For example, bitline set 1 includes even bitline BL1_e and odd bitline BL1_o. Each bitline is connected to at least one NAND cell string, where each NAND cell string includes a plurality of non-volatile memory cells and access transistors connected in series between the respective bitline and a common source line CSL. The access transistors include a source select transistor for receiving a source select line signal SSL, and a ground select transistor for receiving a ground select line signal GSL. Connected serially between these two access transistors are a plurality of non-volatile memory cells, such as Flash memory cells. In the present example, there are 32 serially connected Flash memory cells, having gate terminals coupled to respective wordlines WL1 to WL32.

Sense amplifier and page buffer circuit block 26 includes i page buffer units 60, or one for each bitline set. Because the bitline pitch is narrow, a page buffer unit 60 is shared between the even and odd bitlines of a bitline set. Therefore selection transistors receiving even and odd selection signals BSLe and BLSo are required for selecting one bitline of the set to be coupled to the page buffer unit 60. Each page buffer unit 60 senses and latches data from the bitlines, and those skilled in the art will understand that the page buffer latches write data to be programmed. Each NAND cell string sharing common wordlines WL1-WL32, SSL, and GSL lines is referred to as a memory block, while the memory cells connected to one common wordline is referred to as a page. Those skilled in the art should understand how Flash read, program and erase operations are executed.

FIG. 3 is a circuit schematic of column select circuits of the sense amplifier and page buffer circuit block 26 for coupling data in the page buffer units 60 of FIG. 2 to data lines. The present example of FIG. 3 illustrates one possible logical decoding scheme, where a preset number of page buffers are associated with each of 16 data lines DL1 to DL16. In the present example, there are 16 identically configured dataline decoder circuits 70, one being coupled to each of datalines DL1 to DL16. The following description refers to the dataline decoder circuit 70 coupled to DL1. Dataline decoder circuit 70 includes 16 groupings of 32 page buffer units 60. In each grouping, the input/output terminal of one page buffer unit is coupled to a respective first stage n-channel pass transistor 72. All the first stage n-channel pass transistors are connected in parallel and controlled by first stage selection signals YA1 to YA32 to selectively couple one page buffer unit 60 to one second stage n-channel pass transistor 74. Since there is one second stage n-channel pass transistor 74 per grouping, there are a total of 16 second stage n-channel pass transistors 74 connected in parallel to DL1, each controlled by respective second stage selection signals YB1 to YB16. Because signals YA1 to YA32 and YB1 to YB16 are shared across all the dataline decoder circuits 70, the activation of one first stage selection signal and one second stage selection couples one page buffer unit 60 from each dataline decoder circuit 70, to a corresponding dataline.

In a read, program verify and erase verify operation, the cell data in the selected page should be sensed and latched in their corresponding page buffer units 60. Column decoding then selects which page buffer units to couple to the datalines. Sensing is dependent on the cell current generated by a selected memory cell, and the cell current is dependent on the number of cells in the NAND cell string. In the example of FIG. 2, the cell current is typically less than 1 (µA) for a 32 cell NAND string manufactured with a 90 nm process technology. Unfortunately, the push to increase memory array density to lower device cost results in the addition of more memory cells per NAND cell string. As a result, this cell current will further decrease, thereby requiring more sensitive sensing circuits and/or sensing time. Further compounding this problem is the bitline RC delay due to the physical length of the bitline, and junction capacitance of the NAND cell string as the number of cells per NAND cell string is increased. These physical changes in combination with advanced manufacturing process for reducing feature sizes further exacerbates the cell current problem. This problem with cell current is well known, as demonstrated by June Lee et al., "A 90-nm CMOS 1.8-V 2-Gb NAND Flash Memory for Mass Storage" Applications," IEEE J. Solid-State Circuits, vol. 38, pp. 1934-1942, November 2003. Another further problem related to using advanced manufacturing processes is yield, where long bitlines introduce process uniformity issue across process steps, thereby reducing the yield per wafer as the potential for defects increases.

One possible solution to this problem may be to limit the number of memory cells per NAND cell string, and divide large memory arrays into multiple memory banks. An advantage of having multiple memory banks is the capability of transferring data directly between the memory banks without having to transfer data out from the memory device. The disadvantage of using multiple memory banks is that each bank requires its own set of sense amplifier and page buffer circuit block 26, thereby increasing additional circuit overhead and chip area. The complex circuitry and area overhead required for implementing direct bank to bank data transfer also consumes additional chip area.

SUMMARY

In a first aspect, the present invention provides a memory system. The memory system includes a memory bank and a serial data path. The memory bank provides serial bitstream read data in response to a read operation and receives serial bitstream write data in response to a write operation. The serial data path couples the serial bitstream read data and the serial bitstream write data between the memory bank and an input/output interface. According to one embodiment, the serial data path includes a data arbitrator for receiving access data serially from the input/output interface, the access data including a command and an address. The data arbitrator converts the command and the address into a parallel format and passes the serial bitstream read data to the input/output interface during the read operation. According to another embodiment, the memory bank includes a first bank half, a second bank half and a parallel/serial data converter. The first bank half is coupled to first n parallel datalines, where n is an integer value greater than 0. The second bank half is coupled to second n parallel datalines. The parallel/serial data converter selectively converts one of the first and the second n parallel datalines into the serial bitstream read data and selectively converts the serial bitstream write data into parallel data for one of the first and the second n parallel datalines.

In an aspect of the present embodiment, the first bank half includes a first sector, a second sector and a first page buffer. The first sector has wordlines and bitlines coupled to memory cells. The second sector has wordlines and bitlines coupled to memory cells. The first page buffer is selectively coupled to bitlines of one of the first sector and the second sector, and is coupled to the first n parallel datalines. The second bank half includes a third sector, a fourth sector and a second page buffer. The third sector has wordlines and bitlines coupled to memory cells. The fourth sector has wordlines and bitlines coupled to memory cells. The second page buffer is selectively coupled to bitlines of one of the third sector and the fourth sector, and is coupled to the second n parallel datalines. In the present aspect, the bitlines of the first sector and the second sector are grouped into sets of bitlines, where each of the sets of bitlines are coupled to a common bitline, and the common bitline is coupled to the first page buffer. Similarly, the bitlines of the third sector and the fourth sector are grouped into sets of bitlines, where each of the sets of bitlines is coupled to a common bitline, and the common bitline is coupled to the second page buffer.

In another aspect of the present embodiment, the parallel/serial data converter includes a first parallel/serial data converter, a second parallel/serial data converter and a data path selector. The first parallel/serial data converter sequentially couples each of the first n parallel datalines to a first terminal. The second parallel/serial data converter sequentially couples each of the second n parallel datalines to a second terminal. The data path selector selectively couples one of the first terminal and the second terminal to a bidirectional serial data line. The memory system can further include control logic for receiving a command and an address for operating the memory bank, the parallel/serial converter and the serial data path during the read operation.

In yet another embodiment of the present aspect, the memory system further includes another memory bank for providing the serial bitstream read data in response to the read operation and for receiving the serial bitstream write data in response to the write operation. In the present embodiment, the serial data path includes a data switcher for selectively coupling the serial bitstream write data to one of the memory bank and the other memory bank. Furthermore, the serial data path selectively couples the serial bitstream read data from one of the memory bank and the other memory bank to the data arbitrator of the serial data path. In an alternate embodiment, the memory system further includes another serial data path for coupling the serial bitstream read data from one of the memory bank and the other memory bank to another input/output interface. The other serial data path also couples the serial bitstream write data to one of the memory bank and the other memory bank. The other serial data path can include a second data switcher for selectively coupling the serial bitstream write data to one of the other memory bank and the data switcher, and for selectively coupling the serial bitstream read data to one of the data switcher and another data arbitrator. A serial transfer dataline is provided for coupling the data switcher to the second data switcher. The memory system can further include a serial transfer switch for selectively coupling the serial bitstream read data from one of the memory bank and the other memory bank to the serial data path.

The present invention may provide a method for use in a memory system. The method includes: providing serial bitstream read data in response to a read operation and receiving serial bitstream write data in response to a write operation; and coupling the serial bitstream read data and the serial bitstream write data between the memory bank and an input/output interface.

In a second aspect, the present invention provides a memory bank. The memory bank includes a memory array, a page buffer and a sequential coupler. The memory array has memory cells connected to bitlines and wordlines. The page buffer latches data of the bitlines during a read operation, and couples the latched data to a predetermined number of datalines in parallel. The sequential coupler sequentially couples each of the predetermined number of datalines to a bidirectional serial data line. The sequential coupler can include a parallel/serial data converter having terminals coupled to each of the predetermined number of datalines. The parallel/serial data converter is controllable to sequentially couple each of the terminals to the bidirectional serial data line. The memory bank can further include a counter responsive to a clock signal for controlling the first parallel/serial data converter and the second parallel/serial data converter. The data path selector is controlled by a most significant bit of the counter not used by first parallel/serial data converter and the second parallel/serial data converter.

In an alternate embodiment, the sequential coupler can include a first parallel/serial data converter, a second parallel/serial data converter and a data path selector. The first parallel/serial data converter has first terminals coupled to each of the predetermined number of datalines, and the first parallel/serial data converter is controllable for sequentially coupling each of the first terminals to a first local bidirectional serial data line. The second parallel/serial data converter has second terminals coupled to each of the predetermined number of second datalines, and the second parallel/serial data converter is controllable for sequentially coupling each of the second terminals to a second local bidirectional serial data line. The data path selector selectively couples one of the first local bidirectional serial data line and the second local bidirectional serial data line to a global bidirectional serial data line.

The present invention may provide a method for use a memory array having memory cells connected to bitlines and wordlines. The method includes: latching data of the bitlines during a read operation, and for coupling the latched data to a predetermined number of datalines in parallel; and sequentially coupling each of the predetermined number of datalines to a bidirectional serial data line.

In a third aspect, the present invention provides a memory bank. The memory bank includes a first memory sector, a second memory sector and a page buffer. The first memory sector has memory cells connected to first bitlines and first wordlines, where the first bitlines are arranged as m segments where m is an integer value greater than 0. The second memory sector has memory cells connected to second bitlines and second wordlines, where the second bitlines being arranged as m segments. The page buffer selectively couples one of the first bitlines and the second bitlines of each of the m segments to a predetermined number of datalines. In an embodiment of the present aspect, a read operation is executed by activating a wordline of one of the first wordlines in the first memory sector and the second wordlines in the second memory sector in response to a row address, where at least two memory cells are coupled to the first bitlines when the wordline is one of the first wordlines, and at least two memory cells are coupled to the second bitlines when the wordline is one of the second wordlines; selectively coupling one bitline of the first bitlines and the second bitlines to a common bitline in response to a column address; sensing the common bitline with the page buffer; and providing data corresponding to the sensed common bitline onto one of the predetermined number of datalines.

The present invention may provides a method for use in a memory bank having memory cells connected to first bitlines and first wordlines, the first bitlines being arranged as m segments where m is an integer value greater than 0. The method includes: selectively coupling one of the first bitlines and the second bitlines of each of the m segments to a predetermined number of datalines.

In a fourth aspect, the present invention provides a page buffer for a memory bank. The page buffer including a first self-decoding page buffer stage and a second self-decoding page buffer stage. The first self-decoding page buffer stage senses data from a first set of common bitlines, and provides sensed data. The sensed data corresponds to each of the common bitlines of the first set of common bitlines, which are provided on corresponding data lines in response to an active column select bit latched in a clock signal state. The second self-decoding page buffer stage senses data from a second set of common bitlines, and provides sensed data. The sense data corresponds to each of the common bitlines of the second set of common bitlines, which are provided on the corresponding data lines in response to the active column select bit latched in a subsequent clock signal state. In an embodiment of the present aspect, a self-decoding operation is executed by latching the active column select bit in the first self-decoding page buffer stage in response to an opposite clock signal state; providing the sensed data from the first self-decoding page buffer stage and passing the active column select bit in response to the clock signal state; latching the active column select bit in the second self-decoding page buffer stage in response to a subsequent opposite clock signal state; and providing the sensed data from the second self-decoding page buffer stage in response to the subsequent clock signal state.

The present invention may provide a method for use in a page buffer for a memory bank. The method includes: sensing data from a first set of common bitlines, and for providing sensed data corresponding to each of the common bitlines of the first set of common bitlines on corresponding data lines in response to an active column select bit latched in a clock signal state; and sensing data from a second set of common bitlines, and for providing sensed data corresponding to each of the common bitlines of the second set of common bitlines on the corresponding data lines in response to the active column select bit latched in a subsequent clock signal state.

In a fifth aspect, the present invention provides a system. The system includes a memory controller for providing access data and a serial interconnection of a plurality of memory devices. Each of the memory devices includes a controller, a memory bank and a serial data path. The controller receives the access command and an address contained in access data, for executing an operation corresponding to the access command. The memory bank executes the operation in accordance with the access command to access data stored in a memory location addressed by the address. The serial data path couples the data in serial format between the memory bank and an input/output interface.

For example, the plurality of memory devices are connected in series and the memory controller sends the access command of an instruction, such as for example, read and write commands. In a read operation, the memory device performs a data read operation and forwards the read data to a next memory device or the memory controller. In a write operation, the memory device performs a data write operation based on data provided by the memory controller or a previous memory device. The system, the memory controller and the devices may perform such methods as operating the controller and devices.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a memory system having a serial data interface and a serial data path core for receiving data from and for providing data to at least one memory bank as a serial bitstream. The memory bank is divided into two halves, where each half is divided into upper and lower sectors. Each sector provides data in parallel to a shared two-dimensional page buffer with an integrated self column decoding circuit. A serial to parallel data converter within the memory bank couples the parallel data from either half to the serial data path core. The shared two-dimensional page buffer with the integrated self column decoding circuit minimizes circuit and chip area overhead for each bank, and the serial data path core reduces chip area typically used for routing wide data buses. Therefore a multiple memory bank system is implemented without a significant corresponding chip area increase when compared to a single memory bank system having the same density.

Figure 4A:
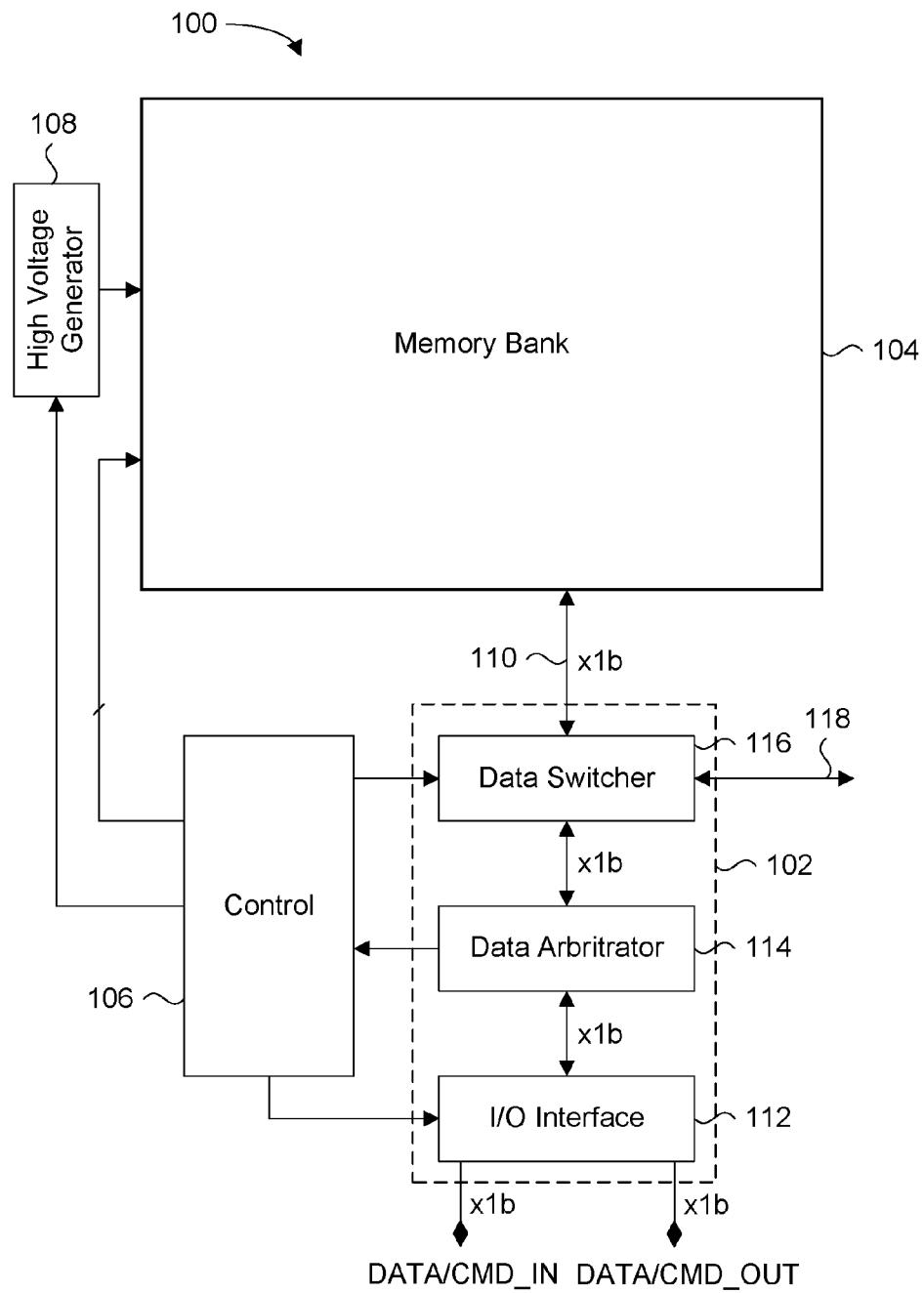
FIG. 4A is a block diagram of a non-volatile memory serial core system according to an embodiment of the present invention.

FIG. 4A is a block diagram of a non-volatile memory serial core system according to an embodiment of the present invention. Serial core memory system 100 includes a serial data path 102 for coupling a serial bitstream of data between external input/output interface pins called the DATA/CMD_IN and DATA/CMD_OUT pins and at least one memory bank 104. A memory bank is understood to include pitch-limited circuits, such as row decoders, sense amplifiers, page buffers, column decoding circuitry, and any other circuits which are formed proximate to the rows and columns of memory cells that make up the memory array. Such circuits are formed proximate to the memory array to maximize the packing density of the circuits while minimizing the transmission path of electrical signals, such as bitline currents and wordline voltages. Other functional blocks of serial core memory system 100 includes a control block 106 and a high voltage generator 108 for providing the necessary voltage levels needed to program and erase the non-volatile memory cells of memory bank 104. The control block 106 includes a command decoder, registers, and other related control circuits (not shown) that are used to govern operation of the serial core memory system 100.

According to the present embodiment, the memory bank 104 is configured to provide read data and to receive write data (for programming), in a serial bitstream. In the example shown in FIG. 4A, both the read data and the write data share a bidirectional serial data line 110, however alternate embodiments can have dedicated input and output unidirectional data lines. In the embodiment of FIG. 4A, the serial data path 102 receives the serial read data and passes it to the DATA/CMD_OUT pin in the serial format, and passes serial write data to the memory bank 104 received from the DATA/CMD_IN pin. Therefore, in both read and write operations, the data is maintained in the serial format between the memory bank and the data I/O pins. Further details of the serial data path 102 will now be described.

The serial data path 102 is primarily responsible for coupling read or write data in a serial format between the memory bank 104 and either of the DATA/CMD_IN pin and the DATA/CMD_OUT pin. Optionally, the serial data path 102 can selectively couple read or write data between two or more memory banks and either the DATA/CMD_IN pin and the DATA/CMD_OUT pin. In another alternate embodiment, the serial data path 102 can couple read data directly between two different memory banks. The serial data path 102 includes a serial I/O interface 112, a data arbitrator 114, and a data switcher 116.

Figure 1A:
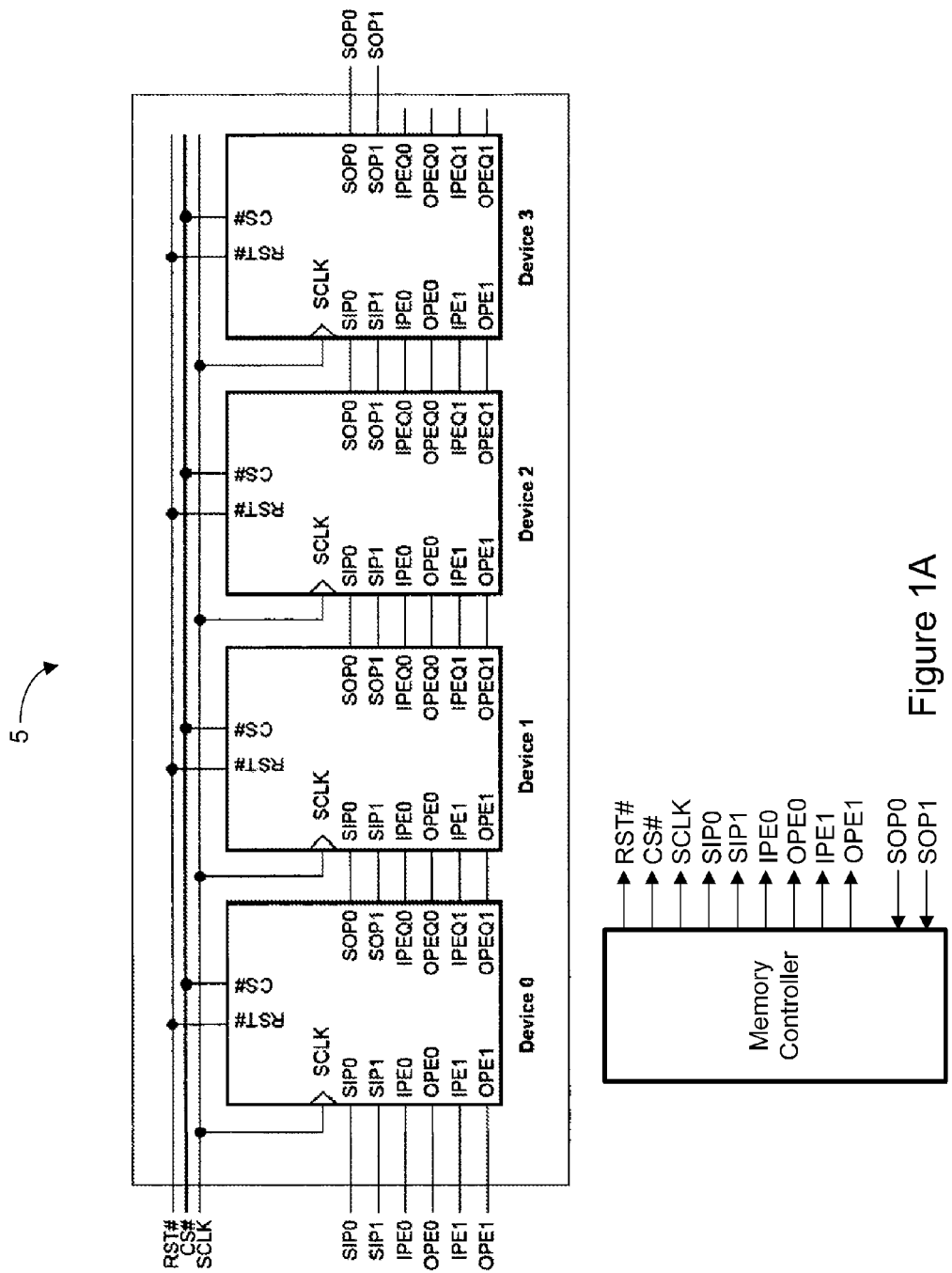
FIG. 1A shows a system of a plurality of memory devices serially connected to each other.
Figure 1B:
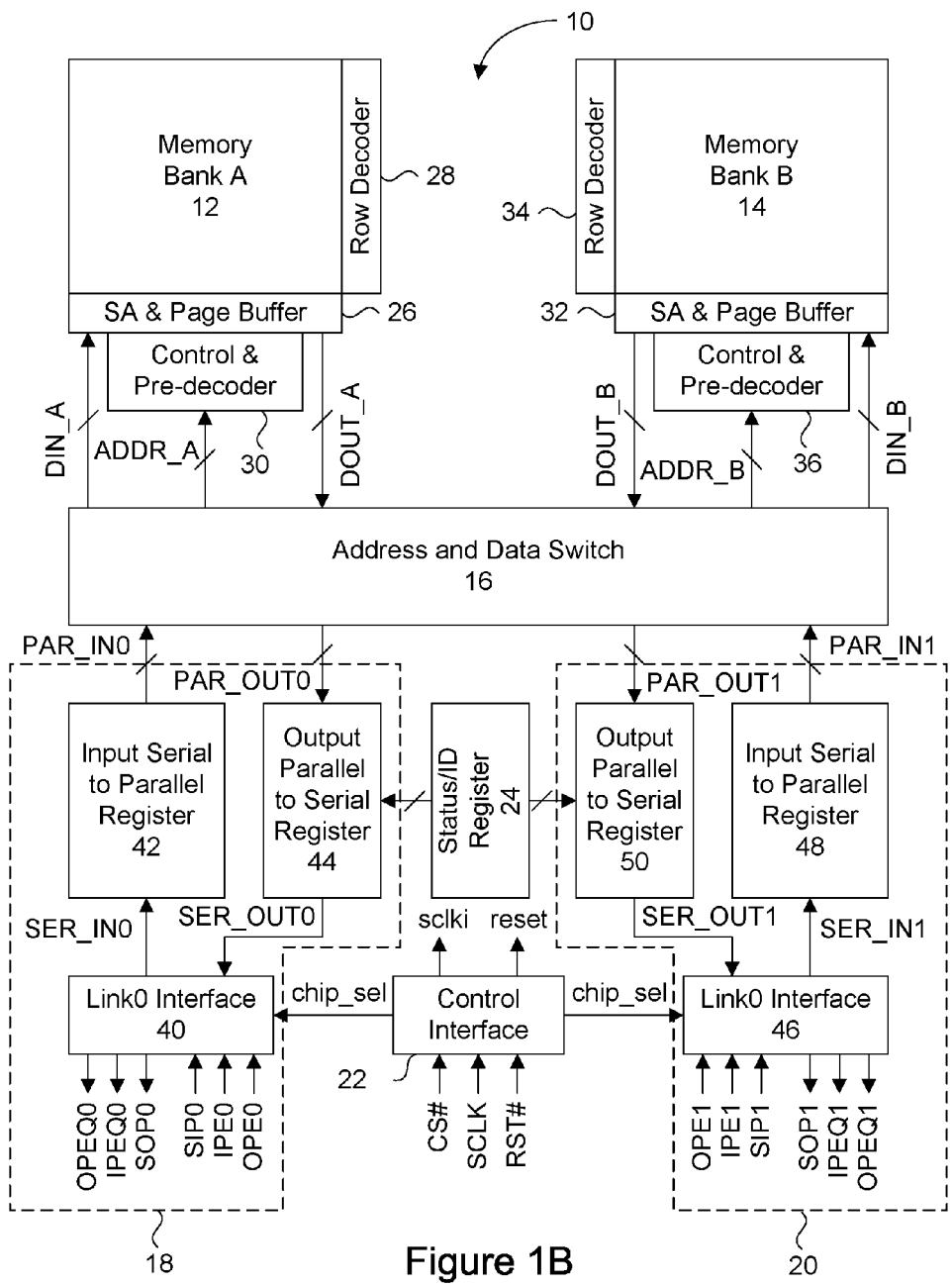
FIG. 1B is a block diagram of a memory device having a serial data interface.
Figure 4B:
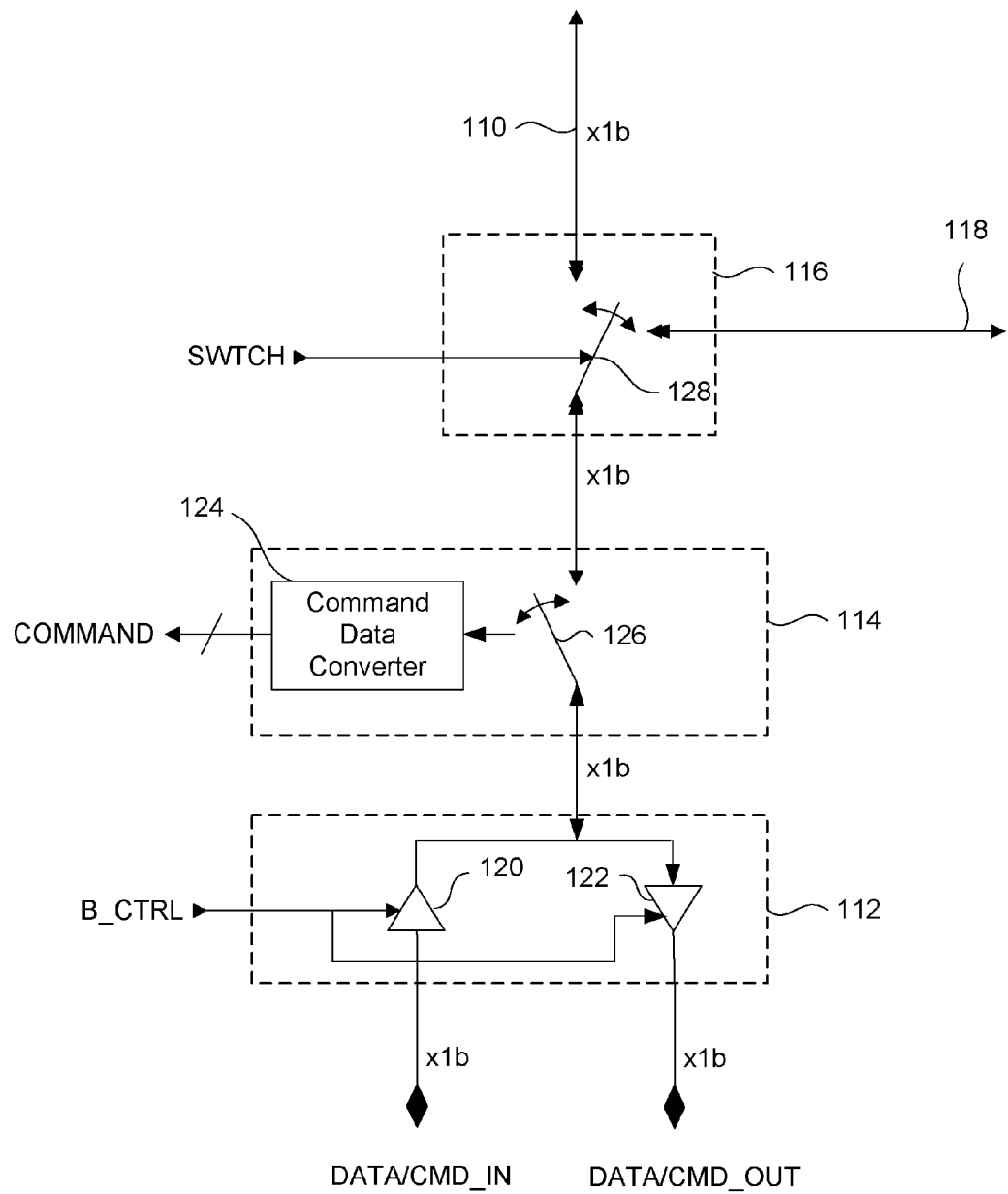
FIG. 4B is a block diagram of illustration of details of a serial data path shown in FIG. 4A.

FIG. 4B shows details of the serial data path 102 shown in FIG. 4A. Referring to FIGS. 4A and 4B, the serial I/O interface 112 is connected directly to the DATA/CMD_IN and the DATA/CMD_OUT pins. The serial I/O interface 112 can be similarly configured to the serial data link 40 of FIG. 1B and include the same circuitry described for it in U.S. Patent Publication No. 20070076479. In the present example, additional control input signals shown in serial data link 40 of FIG. 1B are not shown in order to simplify the schematic. Generally, the serial I/O interface 112 receives and buffers the externally received input data signals, and can include pass through circuits for directly coupling data from the DATA/CMD_IN pin to the DATA/CMD_OUT pin. This feature is used to pass any command with optional data to another memory device if the command is not intended for the current memory device. The serial I/O interface 112 includes input buffers 120 for receiving serial input data from its DATA/CMD_IN pin, and output buffers or output driver 122 for providing read data and pass through data through its DATA/CMD_OUT pin. The input buffers 120 and output drivers 122 are controlled by one or more buffer control signals received from the control block 106, referred to as B_CTRL in FIG. 4A.

The data arbitrator 114 receives the serial data from the serial I/O interface 112. The data arbitrator 114 includes a command data converter 124 and a path switch 126. The command data converter 124 converts only the command data from the serial format into a parallel format, which is then sent to the control block 106 as parallel command signal COMMAND. The path switch 126 selectively connects the serial I/O interface 112 to either the command data converter 124 of the data switcher 116 in response to a switch signal from the control block 106 (not shown). Command data converter 124 can include a serial/parallel shift register that serially receives the command data on each active clock edge, and has parallel outputs from each stage of the shift register for providing the parallel command. Serial/parallel shift registers are known in the art. Since the data structure of the access data is predetermined, for example the command data can be the first two bytes followed by write data, the control block 106 will know when all the command data bits have been loaded into the command data converter 124 by counting the number of clock edges that have passed. Any write data that is received remains in the serial format, and is passed serially to the data switcher 116. Accordingly, command data converter 124 will only receive the command data while the data switcher will only receive the write data.

The data switcher 116 includes another path switch 128 which is controlled by signal SWTCH from the control block 106, to couple serial data between the memory bank and the data arbitrator 114, or to couple serial data between two different memory banks via corresponding serial transfer dataline 118. If there are no other memory banks on the chip, then data switcher 116 is not required and the serial data is provided directly to memory bank 104 from data arbitrator 114.

The operation of the serial core memory system 100 in a read and a write/program operation is now described. In a read operation, it is presumed that a serial read command is received at the DATA/CMD_IN pin, which is then converted into the parallel format and sent to the controller 106 by data arbitrator 114. The controller 106 then activates the appropriate rows and columns in the memory bank 104 to access the desired data. The memory bank 104 is then controlled to provide the read data in a serial bitstream to the data switcher 116. If the read data is to be output to the DATA/CMD_OUT pin, then the data switcher 116 will be controlled to pass the read data to the data arbitrator 114, which simply passes the read data to the serial I/O interface 112 for output via the DATA/CMD_OUT pin.

In a write or program operation, serial data received on the DATA/CMD_IN pin includes a command and write data. The command data includes address data to which the write data is to be programmed. The command data is converted to the parallel format by data arbitrator 114 and passed to control block 106. It is noted that the command is received before the write data in the serial bitstream, so that decoding of the command can be executed for initiating circuits for the programming operation as the write data is passed to the memory bank 104. Because the control block 106 has received a program command, the appropriate programming algorithms are executed and the proper program voltages are applied, to ensure that the write data is programmed to the target address. Additional algorithms such as program verify will also be executed to repeat the programming, if necessary.

As previously described in FIG. 4A, the memory bank 104 provides and receives serial data. However, as persons skilled in the art will understand, memory arrays such as Flash memory are inherently parallel in nature. This means that more than one bit of data is accessed from the memory array and written to the memory array in any single read or write operation, respectively. According to the present embodiment of memory bank 104, an internal parallel/serial converter is provided for converting serial data into a parallel format, and vice versa. More specifically, read data provided in parallel from bitlines of the memory array is converted into serial format, and serial write data is converted into parallel format for simultaneous application to bitlines of the memory array. Furthermore, the memory bank 104 is configured to maximize wordline and bitline performance by segmenting the memory array into sections along both the wordline and the bitline directions.

Figure 2:
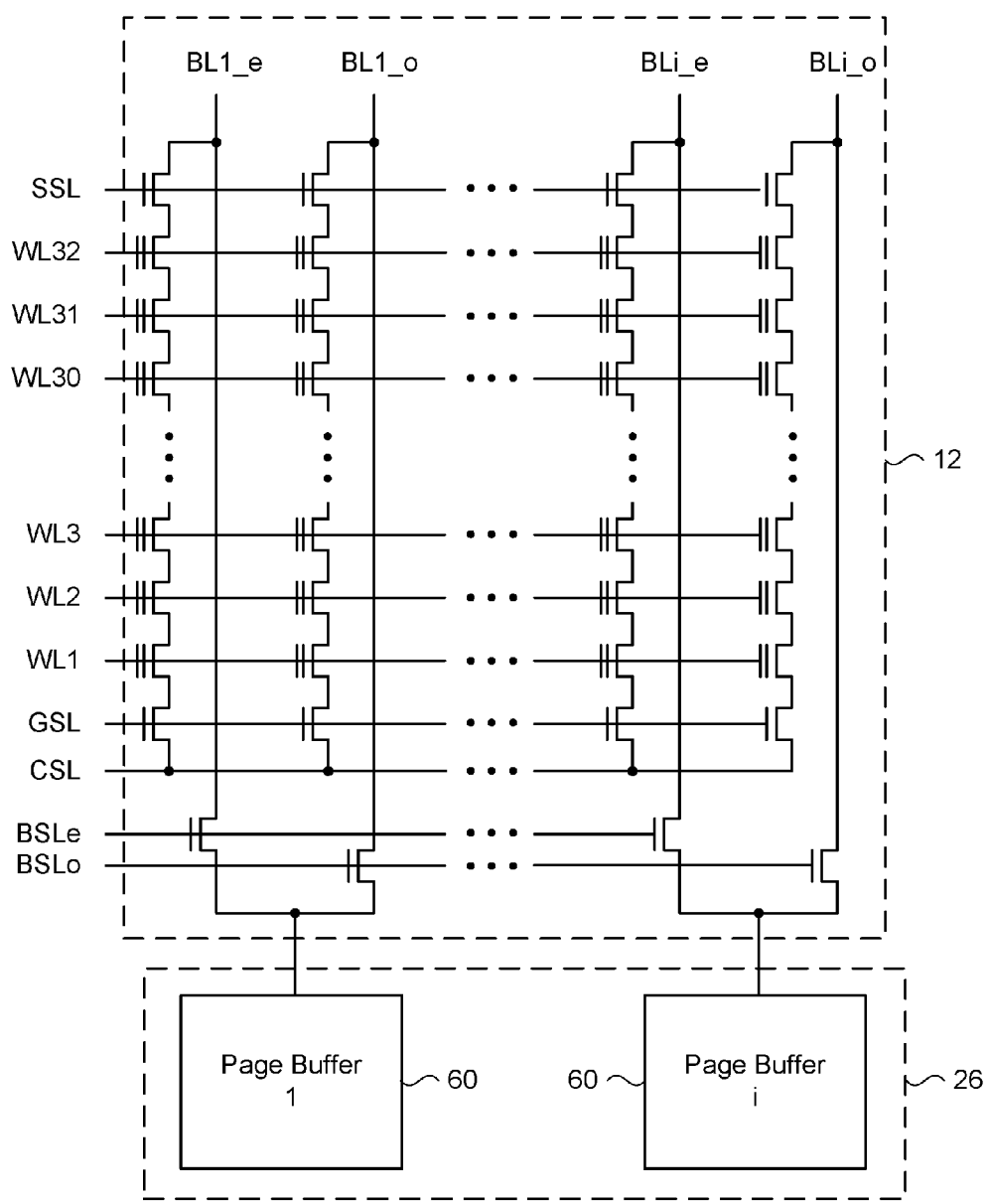
FIG. 2 is a circuit schematic showing NAND cell strings coupled to a sense amplifier and page buffer circuit block of FIG. 1B.
Figure 5:
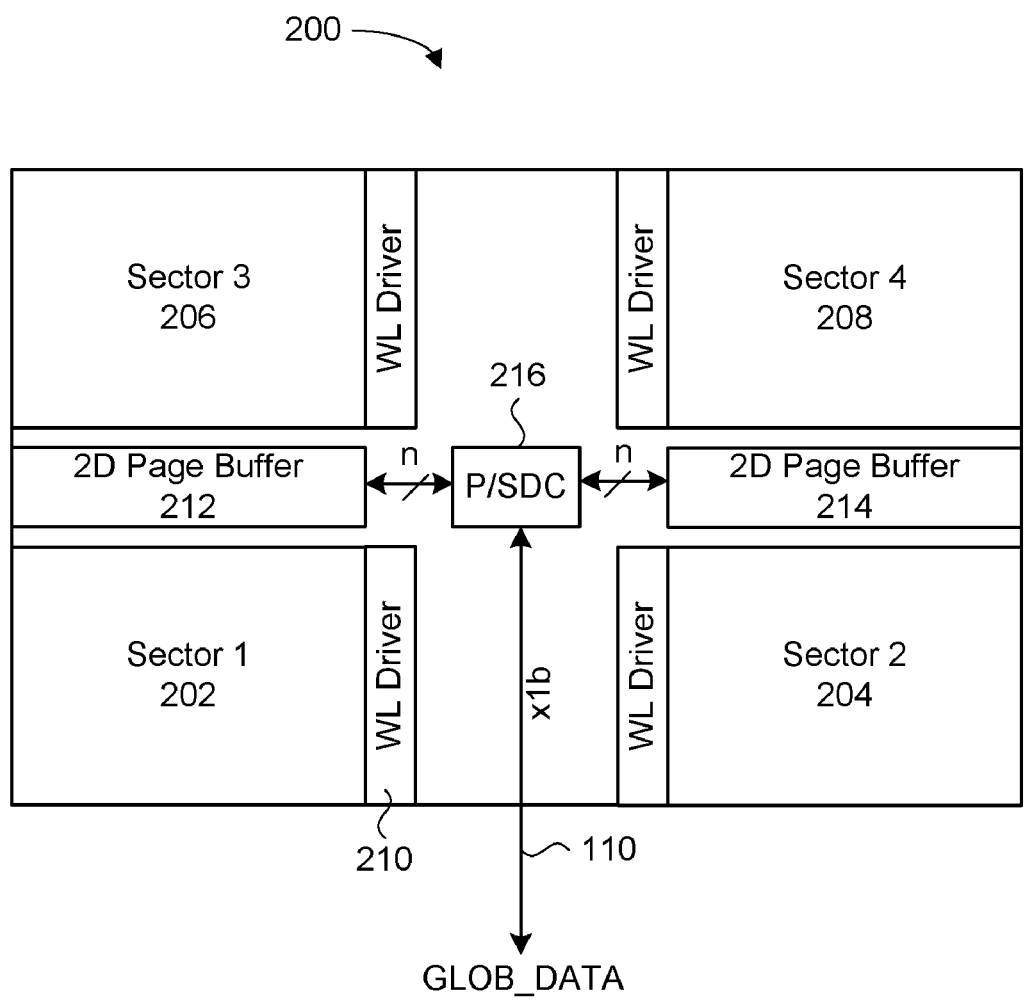
FIG. 5 is a block diagram of a memory bank of FIG. 4A, according to an embodiment of the present invention.

FIG. 5 is a block diagram illustrating an example embodiment of the memory bank 104 of FIG. 4A, according to an embodiment of the present invention. Memory bank 200 is divided into four memory portions, shown as sectors (sector 1, sector 2, sector 3 and sector 4) 202, 204, 206 and 208. In the physical orientation of the memory bank 200 of FIG. 5, each sector includes bitlines extending in the vertical direction and wordlines extending in the horizontal direction. By example, the memory cells can be organized as Flash NAND cell strings similar to those shown in FIG. 2. For driving the wordlines, each sector includes a wordline driver block 210, which can include associated decoding logic for activating a selected wordline during read and program operations. In the present embodiment, the wordline driver blocks 210 corresponding to sectors 202 and 204 activate the same logical wordline of a row in response to a row address within a first address range, while the wordline driver blocks 210 corresponding to sectors 206 and 208 activate the same logical wordline of a row in response to a row address within a second address range. In other words, the rows of memory bank 200 are accessed in the same manner as a traditional memory array consisting of a single large sector having the same number of rows. However, wordline performance is improved since each wordline row is divided into shorter segments that are driven by their own wordline driver blocks 210. Accordingly, the central location of the wordline driver blocks 210 divide the memory bank into left and right bank halves, where sectors 202 and 206 form the left half and sectors 204 and 208 form the right half.

For sensing bitline data and latching program data, sectors 202 and 206 have their bitlines coupled to shared page buffer 212, while sectors 204 and 208 have their bitlines coupled to shared page buffer 214. Accordingly, sectors 202 and 204 can be referred to as lower sectors while sectors 206 and 208 can be referred to as upper sectors. Page buffers 212 and 214 are configured to be selectively coupled to one of an upper sector and a lower sector, thereby overcoming the need to have separate sets of page buffers for each sector. This contributes to the area minimization of the area of memory bank 200. Further details of the shared page buffers 212 and 214 will be described later. Page buffers 212 and 214 sense and latch in parallel, bitline data in response to an activated wordline during a read operation. The data associated with the memory cells connected to a single wordline is commonly referred to as a page of data. In the presently described configuration of FIG. 5 where wordlines in both halves of the memory bank are logically the same, page buffer 212 senses and latches a first half page of data and page buffer 214 senses and latches a second half page of data. As those skilled in the art would understand, the page buffers 212 and 214 sense and latch the bitline data in parallel upon activation of the selected wordline. Once latched, this read data will eventually be output as a serial bitstream.

As will be shown later, a first set of input/output datalines is coupled to page buffer 212, and a second set of input/output datalines is coupled to page buffer 214. The width of the sets of datalines will be n bits wide, where n is an integer value greater than 1. Located between the two halves is a parallel/serial data conversion selector (P/SCS) 216, which functions as a sequential coupler, that is coupled to the sets of datalines coupled to page buffers 212 and 214. The parallel/serial data conversion selector 216 is placed such that both sets of datalines are the same physical length, and preferably a minimum physical length to minimize loading capacitance. In the present embodiment, the parallel/serial conversion selector 216 converts parallel data from the shared buffer 212 to serial format onto dataline 110 or converts parallel data from the shared buffer 214 to serial format onto bidirectional serial dataline 110. More specifically, each of the n datalines is sequentially coupled to the single bidirectional serial data line 110 as a signal called GLOB_DATA. The parallel/serial conversion selector 216 converts serial data on bidirectional serial data line 110 to parallel format for the n datalines coupled to shared page buffer 212 or shared page buffer 214. For example, the parallel/serial conversion selector 216 is controlled to couple each of the n datalines corresponding to page buffer 212 to bidirectional serial data line 110, followed by each of the n datalines corresponding to page buffer 214.

Following is an example for illustrating the relationship of the number of datalines and the half page size of data stored in either of page buffers 212 and 214. For example, if page buffer 212 latches a 1024 bit half page, and the dataline is 16 bits wide, then parallel/serial conversion selector 216 will cycle through 1024/16=64 sets of 16 bit wide data. Once all 1024 bits are serially output onto serial data line 110, then the next 1024 bits from page buffer 214 are provided. Details of this implementation will be shown later. A program operation is the reverse process of the read operation in which serial write data is provided on serial data line 110. In the present example, 16 bits are applied in parallel to the page buffer 212 via the 16 datalines in each cycle.

The embodiment of FIG. 5 shows a memory bank 200 having left and right halves. In an alternate configuration, the memory array includes only two sectors, such as sectors 202 and 206. Sector 206 can thus be the aggregate size of sectors 206 and 208 and sector 202 can be the aggregate size of sectors 202 and 204. In such configuration, a full page of data would be latched by page buffer 212.

Figure 6:
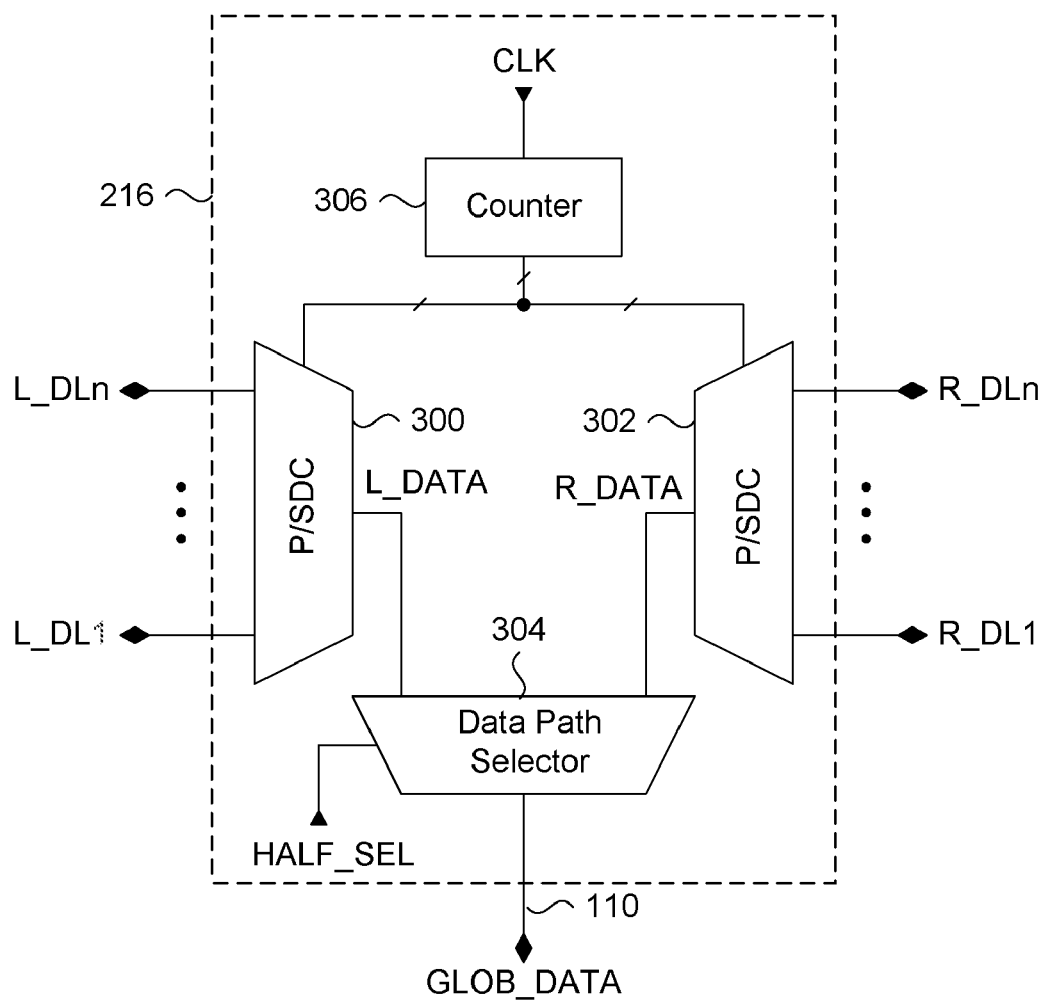
FIG. 6 is a circuit schematic embodiment of the parallel/serial data converter shown in FIG. 5.

FIG. 6 is a circuit schematic of parallel/serial data converter 216 according to an embodiment of the present invention. Referring to FIG. 6, the P/S data conversion selector 216 includes a first parallel/serial data converter (P/SDC) 300, a second P/SDC 302, and a data path selector 304. P/SDC 300 and P/SDC 302 can be implemented as identical bidirectional n to 1 multiplexor/demultiplexor switches, and data path selector 304 can be implemented as is a bidirectional 2 to 1 multiplexor/demultiplexor switch. P/SDC 300 selectively couples each of the left side datalines L_DL1 to L_DLn to the local bidirectional serial data line L_DATA terminal, while P/SDC 302 selectively couples each of the right side datalines R_DL1 to R_DLn to the local bidirectional serial data line R_DATA terminal. Data path selector 304 selectively couples either L_DATA or R_DATA to the global bidirectional serial data line 110 as GLOB_DATA. In order to sequentially couple each of the datalines to the output, a counter 306 can be used to provide outputs that are decoded within P/SDC 300 and P/SDC 302 in response to a clocked signal CLK. Such counter decoding schemes should be well known to those of skill in the art. Accordingly, L_DATA and R_DATA are n bits in length for one cycle of the counter. Data path selector 304 is controlled by a selection control signal HALF_SEL to allow all n bits of L_DATA to pass through in one logic state, and to allow all n bits of R_DATA to pass through in the opposite logic state. Signal HALF_SEL can be generated by the control block 106 of FIG. 4A in relation to a column address that can select which half of the memory bank 200 is to be accessed. In the embodiment of FIG. 6, counter 306 is shared with P/SDC 300 and P/SDC 302 to minimize circuit overhead since dedicated counters would unnecessarily consume chip area.

A seamless transition between the L_DATA and R_DATA bits is achieved by coupling signal HALF_SEL to a most significant bit (MSB) that is not used by P/SDC 300 or P/SDC 302, and will toggle states after the last dataline (L_DLn or R_DLn) is coupled to the L_DATA or R_DATA terminal. Using P/SDC 300 for example, if n=4, there will be a total of four datalines (L_DL1 to L_DL3), and a two bit signal is required to selectively couple each of the four data lines to L_DATA. Because the outputs of counter 306 are coupled to P/SDC 300 and P/SDC 302, they will switch at the same time. However, the state of HALF_SEL will dictate whether L_DATA or R_DATA is passed onto GLOB_DATA. Therefore, a third and most significant bit can be used to control HALF_SEL, which will change states only after the fourth and last dataline L_DL4 is coupled to L_DATA. Table 1 below steps through a sequence using the n=4 example.

TABLE 1

| State | Bit 2 HALF_SEL | Bit 1 | Bit 0 |
|---|---|---|---|
| 1 | 0 | 0 | 0 |
| 2 | 0 | 0 | 1 |
| 3 | 0 | 1 | 0 |
| 4 | 0 | 1 | 1 |
| 5 | 1 | 0 | 0 |
| 6 | 1 | 0 | 1 |
| 7 | 1 | 1 | 0 |
| 8 | 1 | 1 | 1 |

In states 1 to 4, Bit 2 remains at the low logic state, while Bit 1 and Bit 2 are used by P/SDC 300 to couple L_DL1 to L_DL4 to L_DATA. Starting at state 5, Bit 2 toggles to the high logic state as the counter increments, and remains at the high logic state until state 8. Bit 1 and Bit 2 "restart" at state 5 and gradually increment as in states 1 to 4. Accordingly, Bit 2 is suitable as the HALF_SEL control signal as it inherently controls when data path selector 304 is to switch over from L_DATA to R_DATA.

Figure 7A:
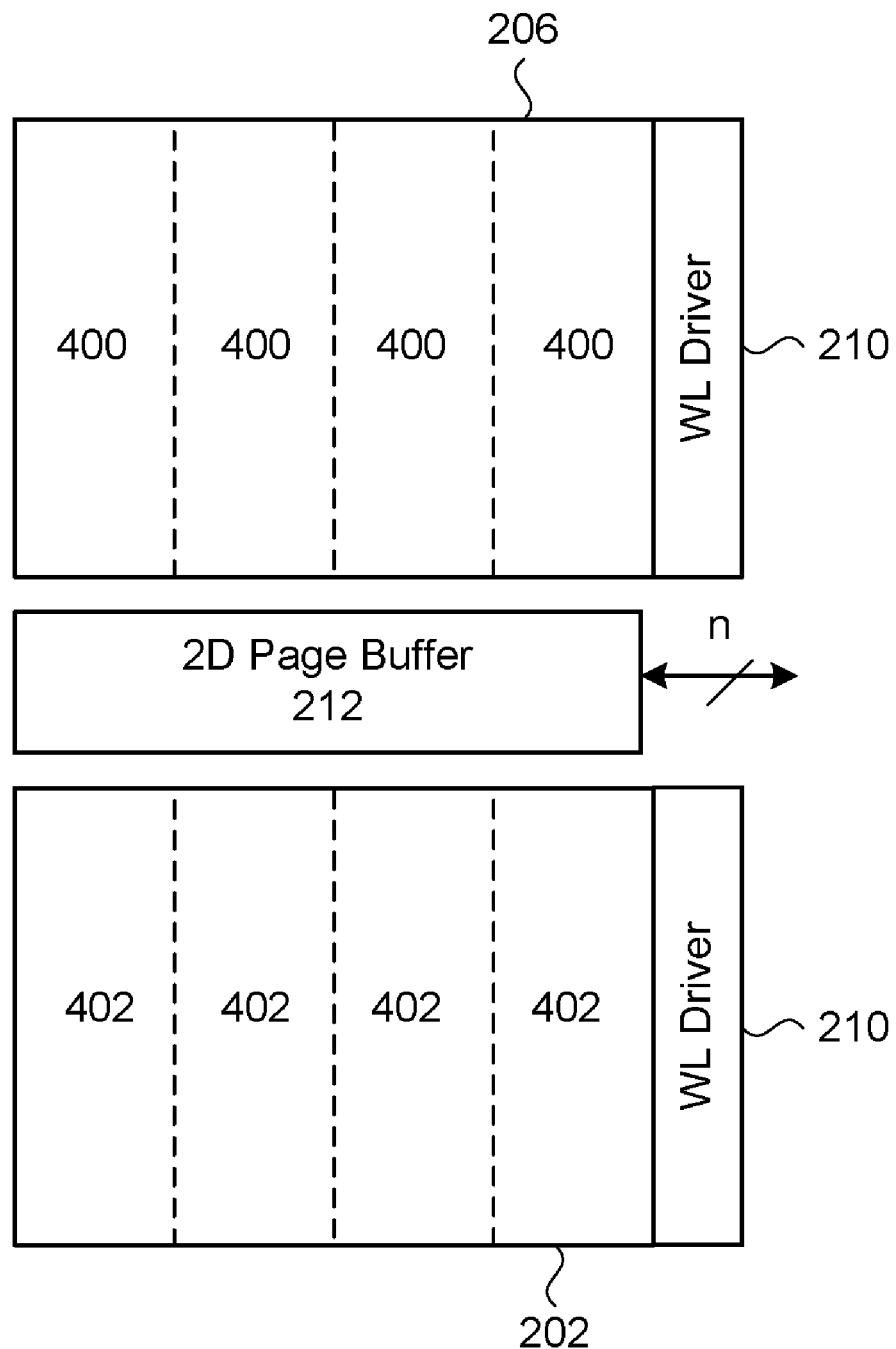
FIG. 7A is a block diagram showing details of two sectors of the memory bank of FIG. 5.
Figure 7B:
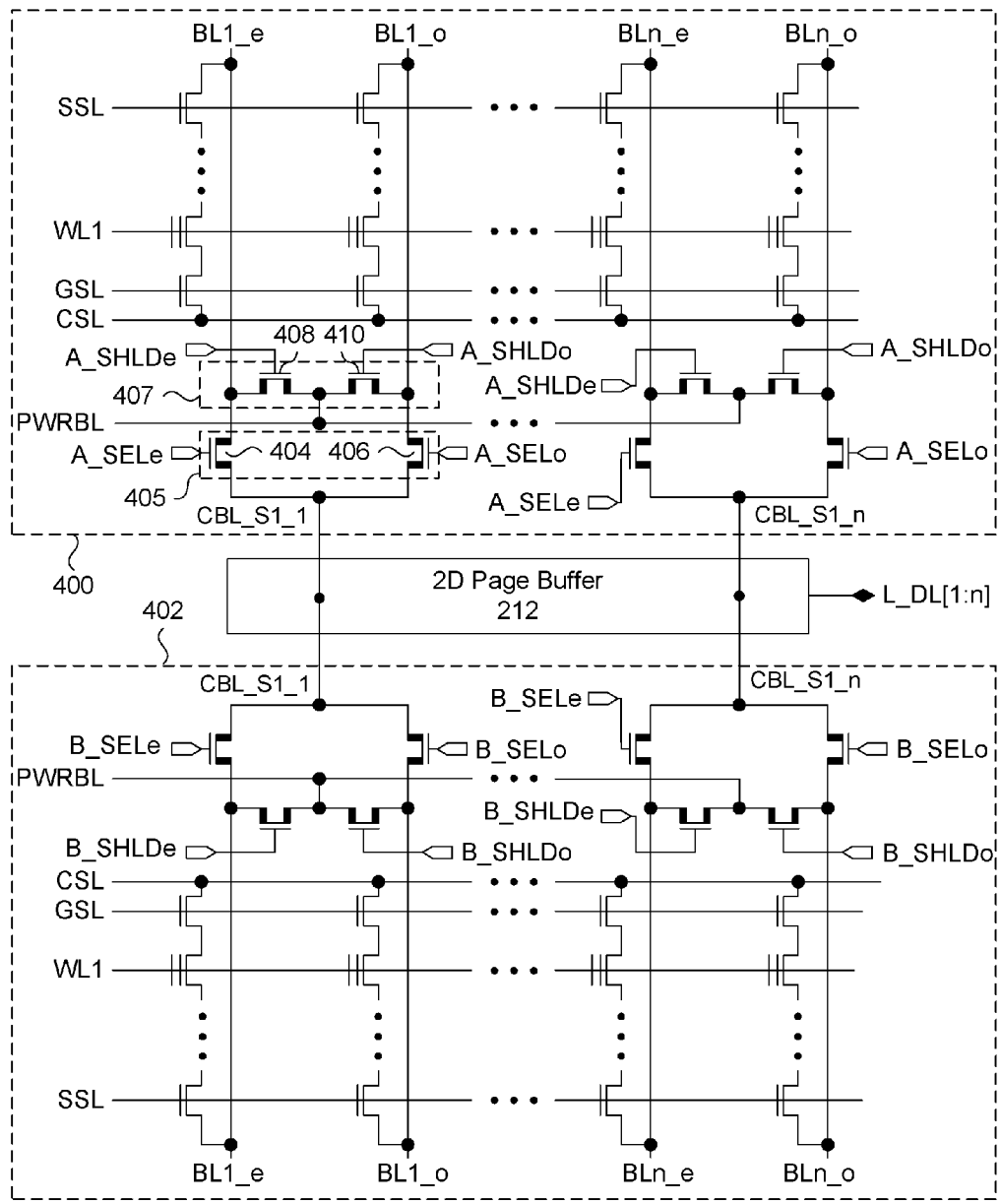
FIG. 7B is a circuit schematic embodiment showing the bitline arrangement of the sectors shown in FIG. 5.

Now that the parallel/serial data conversion selector (P/SCS) 216 has been discussed, details of the memory bank sectors and page buffers of FIG. 5 will be described with reference to FIGS. 7A to 11. FIG. 7A is an enlarged schematic of sectors 202 and 206 with shared page buffer 212. More specifically, FIG. 7A illustrates subdivisions of sectors 202 and 206, referred to as segments. In the present example, sector 202 is divided into four equally sized and identically configured segments 402 while sector 206 is divided into four equally sized and identically configured segments 400. The selection of four segments per sector is by example only, as those skilled in the art will understand that the number of segments per sector is a design parameter for the memory bank. As will be shown in further detail in FIG. 7B, each segment 400 and 402 includes the same number of bitlines. FIG. 7B is a schematic showing one sector 400, one segment 402, and their interconnection with page buffer 212 of shown in FIG. 7A. Segments 400 and 402 can each provide n bits of data via data lines L_DL[1:n] in any single read operation.

The bitlines of each segment 400 and 402 are arranged as sets of bitlines, and in the present example of FIG. 7B, each set includes even and odd bitlines BL1_e/BL1_o to BLn_e/BLn_o. Each set of even and odd bitlines is selectively coupled to respective common bitlines CBL_S1_1 to CBL_S1_n, and each common bitline is coupled to page buffer 212. The term "S1" indicates that the common bitline CBL belongs to the first segment (400 or 402) of the sector, and the last digit indicates the specific common bitline of the first segment. The bitlines of segment 400 are identically configured to those of segment 402. In the present embodiment, bitline BL1_e of segment 402 is logically the same as bitline BL1_e of segment 400, as are the other bitlines having common labels. In other words, the bitlines of segments 402 and 400 in the present configuration are equivalent to a single bitline of memory bank 12 of FIG. 2. The advantage of dividing bitlines into two physical sections is that the bitlines of each sector are half as long as the bitlines of memory bank 12. By reducing the length of the bitline as seen by each NAND cell string connected to it, the capacitive loading of the bitline is significantly reduced. Hence, each NAND cell string can be configured to have more cells, thereby increasing the density of the memory array.

In addition to the Flash memory cells, the source select transistor and the ground select transistor, each set of even and odd bitlines of segments 400 and 402 further include a program disable circuit and an even/odd bitline selection circuit coupled thereto. The description of these two circuits coupled to BL1_e and BL1_o of segment 400 follows. The bitline selection circuit 405 includes high voltage n-channel transistors 404 and 406, where transistor 404 selectively couples BL1_e to a common bitline CBL_S1_1 and transistor 406 selectively couples BL1_o to common bitline CBL_S1_1. Common bitline CBL_S1_1 is connected to page buffer 212, and to the bitline selection circuit of segment 402. N-channel transistors 404 and 406 are controlled by decoded even and odd selection signals A_SELe and A_SELo respectively. The prefix "A" denotes signals associated with segment 400, while prefix "B" denotes signals associated with segment 402. Therefore, during a read or program operation for segment 400, only one of bitlines BL1_e and BL1_o will be coupled to page buffer 212. It is noted that selection signals A_SELe and A_SELo are shared with the other bitline selection circuits in segment 402.

The program disable circuit 407 includes high voltage n-channel shielding transistors 408 and 410 serially connected between bitlines BL1_e and BL1_o. The common terminal of transistors 408 and 410 is connected to a program inhibit voltage level PWRBL, which is selectively coupled to either BL1_e and BL1_o during either a read or a program operation by activating shielding signals A_SHLDe or A_SHLDo respectively. For example, when BL1_e is selected for a programming operation, then BL1_o will be biased to VCC, or any other voltage sufficient to inhibit programming, through PWRBL to inhibit programming to any memory cells coupled to BL1_o. During read operations on the other hand, PWRBL will be set to VSS to bias the unselected bitlines to VSS. The corresponding program disable circuit and even/odd bitline selection circuit for BL1_e and BL1_o is identically configured to the previously described circuits, except that they are controlled by a different set of signals, namely B_SHLDe, B_SHLDo, B_SELe and B_SELo. PWRBL can be driven by an inverter circuit supplied by VCC and VSS, or the program inhibit voltage and VSS, and controlled by a programming related signal. As will be shown in FIG. 8, a row address is used to generate the selection signals and the shielding signals for either segments 400 or 402, while a column address is used to generate the even and odd selection and shielding signals.

Figure 8:
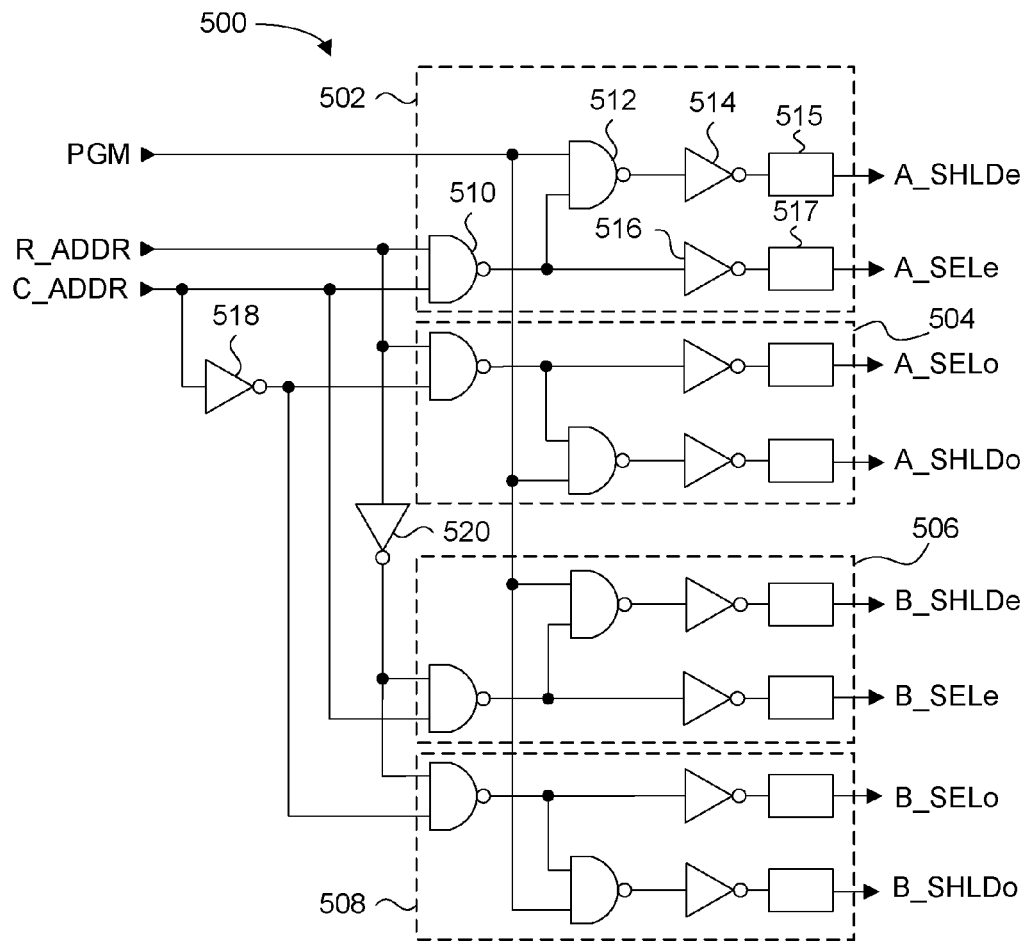
FIG. 8 is a circuit schematic embodiment of a decoding circuit for controlling the bitline selection circuit of FIG. 7.

FIG. 8 is an example decoding circuit which can be used for generating the selection signals and the shielding signals for the bitline selection circuit 405 and the program disable circuit 407 in both segments 400 and 402 shown in FIG. 7B. Those skilled in the art will understand that the example embodiment of FIG. 8 is one decoding configuration, and that other decoding configurations can be used for achieving the same result.

Referring to FIG. 8, decoding circuit 500 includes four identically configured sub-decoders 502, 504, 506 and 508. The description of each sub-decoder will be made with reference to the logic circuits of sub-decoder 502, since all the sub-decoders are identically configured. Each sub-decoder, such as sub-decoder 502, includes an address decoding NAND gate 510, a shield enable NAND gate 512, inverters 514 and 516, and local charge pumps 515 and 517. Address decoding NAND gate 510 receives a row address R_ADDR and a column address C_ADDR, and provides an output that is provided to one input terminal of shield enable NAND gate 512 and to inverter 516. The output of inverter 516 is boosted by local charge pump 517 to provide the even signal A_SELe, which is received by all the bitline selection circuits in segment 400. Therefore, A_SELe is an address decoded signal driven to the active logic level in response to a particular combination of R_ADDR and C_ADDR. In the present example, this occurs when both R_ADDR and C_ADDR are at the high logic level. The second input terminal of shield enable NAND gate 512 receives a program status signal PGM, which is decoded with the output of address decoding NAND gate 510. The output of NAND gate 512 is driven by inverter 514 and boosted by local charge pump 515 to provide signal A_SHLDe.

The purpose of the local charge pumps is to drive the high logic level of the signals above the supply voltage VCC. As previously mentioned, during a read operation the unselected bitlines are biased to VSS via PWRBL at VSS. For example, one of A_SHLDe or A_SHLDo will be driven to VCC, which is sufficient for discharging the unselected bitline to VSS. However during a program operation where unselected bitlines are to be biased to VCC through PWRBL, signals A_SHLDe or A_SHLDo at VCC will be insufficient for passing the full VCC level to the bitlines. Therefore, the local charge pumps will ensure that the gate terminals of the shielding transistors, such as shielding transistors 408 and 410, can be driven above VCC. This same principle applies to the bitline selection transistors, such as transistors 404 and 406. During the programming operation, the page buffer will drive the common bitlines to either VCC or VSS, depending on the data to be programmed. In order to fully pass VCC to the selected bitlines, signals A_SELe and A_SELo are driven to a voltage level above VCC.

By example, signal A_SHLDe is a signal that is driven to the active logic level when the particular combination of R_ADDR and C_ADDR is present, i.e., both are at the high logic level. While C_ADDR is a single bit signal in the present embodiment for coupling one of two bitlines to the common bitline (CBL_S1_1_for example), those skilled in the art will understand that the decoding circuit of FIG. 8 can be configured to receive C_ADDR of any number of bits. Hence, one of many bitlines can be selectively coupled to the common bitline, provided the program disable circuits and the bitline selection circuits are expanded to include more n-channel transistors corresponding to transistors 404, 406, 408 and 410.

Sub-decoder 504 is identically configured to sub-decoder 502, except that its address decoding NAND gate 510 receives the opposite logic level of C_ADDR via inverter 518 for driving A_SELo to the active logic level and A_SHLDo to the active logic level when PGM is at the active logic level. Sub-decoders 502 and 504 drive signals for segment 400 since the same row address R_ADDR is used. Therefore sub-decoders 504 and 506 will drive signals B_SELe, B_SHLDe; and B_SELo, B_SHLDo for segment 402 since they receive the opposite state of R_ADDR via inverter 520. Because sub-decoder 506 receives C_ADDR and sub-decoder 508 receives the opposite state of C_ADDR via inverter 518, the even and odd selection and shield signals are provided.

Program status signal PGM is shared by all the shield enable NAND gates 512 of the sub-decoders 502, 504, 506 and 508, to globally enable or disable production of its respective shielding signals. In the present embodiment, PGM is at the active high logic level during a program operation to ensure that the proper shielding signal is activated so that the non-selected bitline adjacent to the selected bitline, is coupled to PWRBL to inhibit programming of memory cells connected to it. In an alternate method of operation, PWRBL can be inhibited from being applied to all the bitlines during a read operation, because the non-selected bitline can be subsequently selected by changing the column address C_ADDR while the selected wordline remains active, to read more data from the memory array.

With this understanding of the decoding scheme shown in the embodiments of FIG. 7 and FIG. 8, a read operation and a write operation of the circuits shown in FIG. 7 can be easily understood. In a read operation, PGM is at the low logic level and a wordline is activated in all the segments, including segments 400 and 402, of sector 202 or 206 of FIG. 5. A current corresponding to a stored data state in the corresponding memory cells is then provided to a respective bitline. If the row address activates a wordline in segment 400, then the selection signals B_SELe, B_SELo, B_SHLDe and B_SHLDo for segment 402 are disabled. In response to a specific column address C_ADDR, one of the even or odd bitlines of each set of bitlines is coupled to a corresponding common bitline. The page buffer 212 will sense and latch the data of all the common bitlines of the sector, but will provide only the data from one segment in parallel on data lines L_DL[1:n]. The common datalines L_DL[1:n] are shared by all the segments in sectors 200 and 206, and as will be described later, the data from exactly one segment is coupled to datalines L_DL[1:n]. More specifically, all the data of either segment 400 or 402 is output by sequentially enabling the page buffer 212 segments to couple data to datalines L_DL[1:n].

A program operation is the reverse process, except now PGM is at the high logic level. Write data will be provided on data lines L_DL[1:n] to be latched by page buffer 212 and driven onto the respective common bitlines. If a wordline in segment 400 is selected for programming, then the selection signals A_SELe, A_SELo, A_SHLDe and A_SHLDo are disabled. It is noted that since no wordline in segment 402 is selected, there is no need to apply the PWRBL program inhibit voltage to the bitlines, thereby reducing power consumption. A column address C_ADDR is provided and the common bitlines will be coupled to the selected bitlines of the even or odd bitlines, while the PWRBL voltage is applied to the non-selected bitlines.

Figure 9:
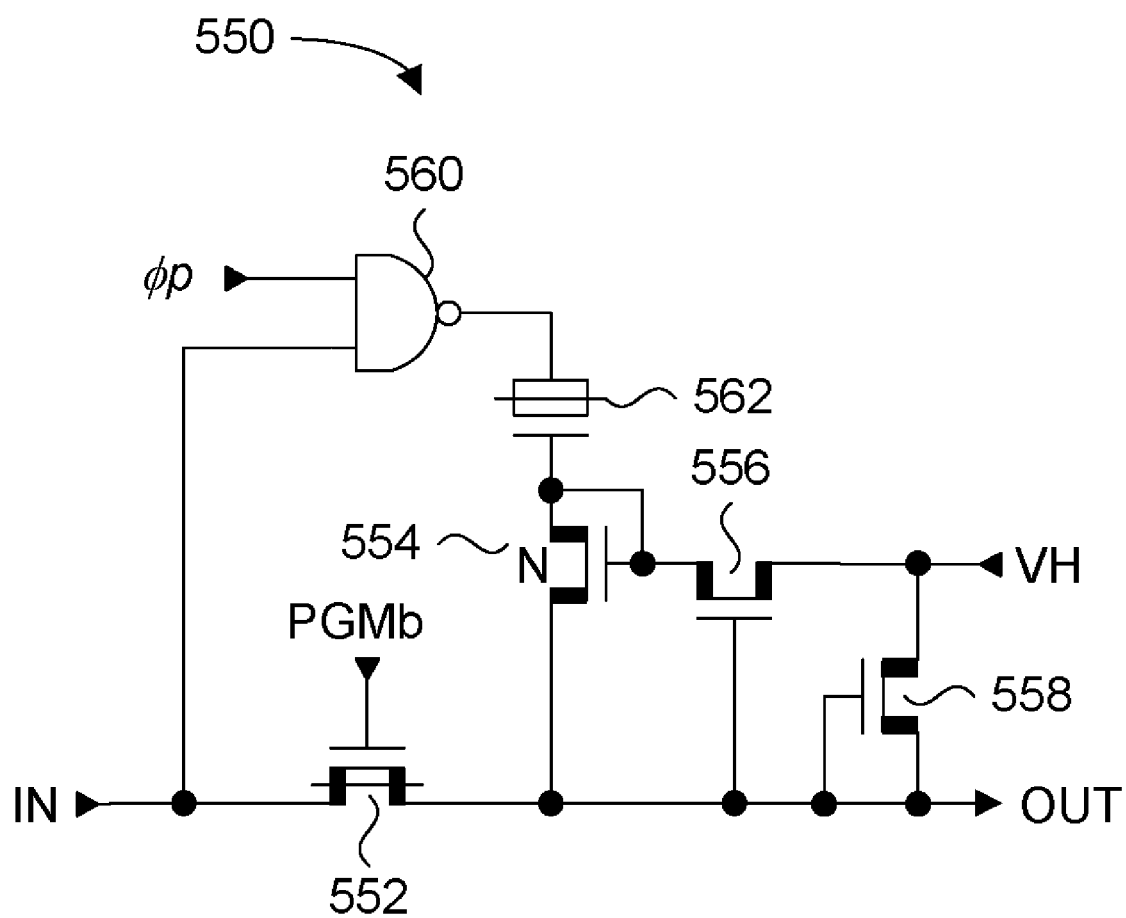
FIG. 9 is a circuit schematic of the charge pump shown in FIG. 8.

FIG. 9 is a circuit schematic illustrating an example local charge pump used in the sub-decoders of FIG. 8. Local charge pump 550 includes a depletion mode n-channel pass transistor 552, a native n-channel diode-connected boost transistor 554, a high breakdown voltage n-channel decoupling transistor 556, a high breakdown voltage n-channel clamp transistor 558, a NAND logic gate 560, and a capacitor 562. NAND logic gate 560 has one input terminal for receiving input terminal IN and another input terminal for receiving controlled signal $\phi p$, for driving one terminal of capacitor 562. Pass transistor 552 is controlled by the complement of signal PGM of FIG. 8, referred to as PGMb. The common terminals of decoupling transistor 556 and clamp transistor 558 are coupled to high voltage VH.

The operation of local charge pump 550 is now described. During a read operation, PGMb is at the high logic level and $\phi p$ is maintained at the low logic level. Therefore, circuit elements 562, 554, 556 and 558 are inactive, and the output terminal OUT reflects the logic level appearing on the input terminal IN. During a program operation, PGMb is at the low logic level, and $\phi p$ is allowed to oscillate between the high and low logic levels at a predetermined frequency. If the input terminal IN is at the high logic level, then capacitor 562 will repeatedly accumulate charge on its other terminal and discharge the accumulated charge through boost transistor 554. Decoupling transistor 556 isolates VH from the boosted voltage on the gate of boost transistor 554. Clamp transistor 558 maintains the voltage level of output terminal OUT at about VH+Vtn, where Vtn is the threshold voltage of clamp transistor 558. The local charge pump 550 shown in FIG. 9 is one example circuit which can be used to drive signals to a voltage levels higher than the supply voltage VCC, but persons skilled in the art will understand other charge pump circuits can be used with equal effectiveness. Table 2 below shows example bias conditions for the local charge pump 550 during read and program operations.

TABLE 2

|  | Read | | Program | |
| --- | --- | --- | --- | --- |
|  | Selected | Unselected | Selected | Unselected |
| IN | Vcc | Vss | Vcc | Vss |
| PGMb | Vcc | Vcc | Vss | Vss |
| φP | Vss | Vss | Oscillation | Oscillation |
| VH | Vcc | Vcc | ~5 V | ~5 V |
| OUT | Vcc | Vss | 5 V + Vtn | Vss |

Figure 3:
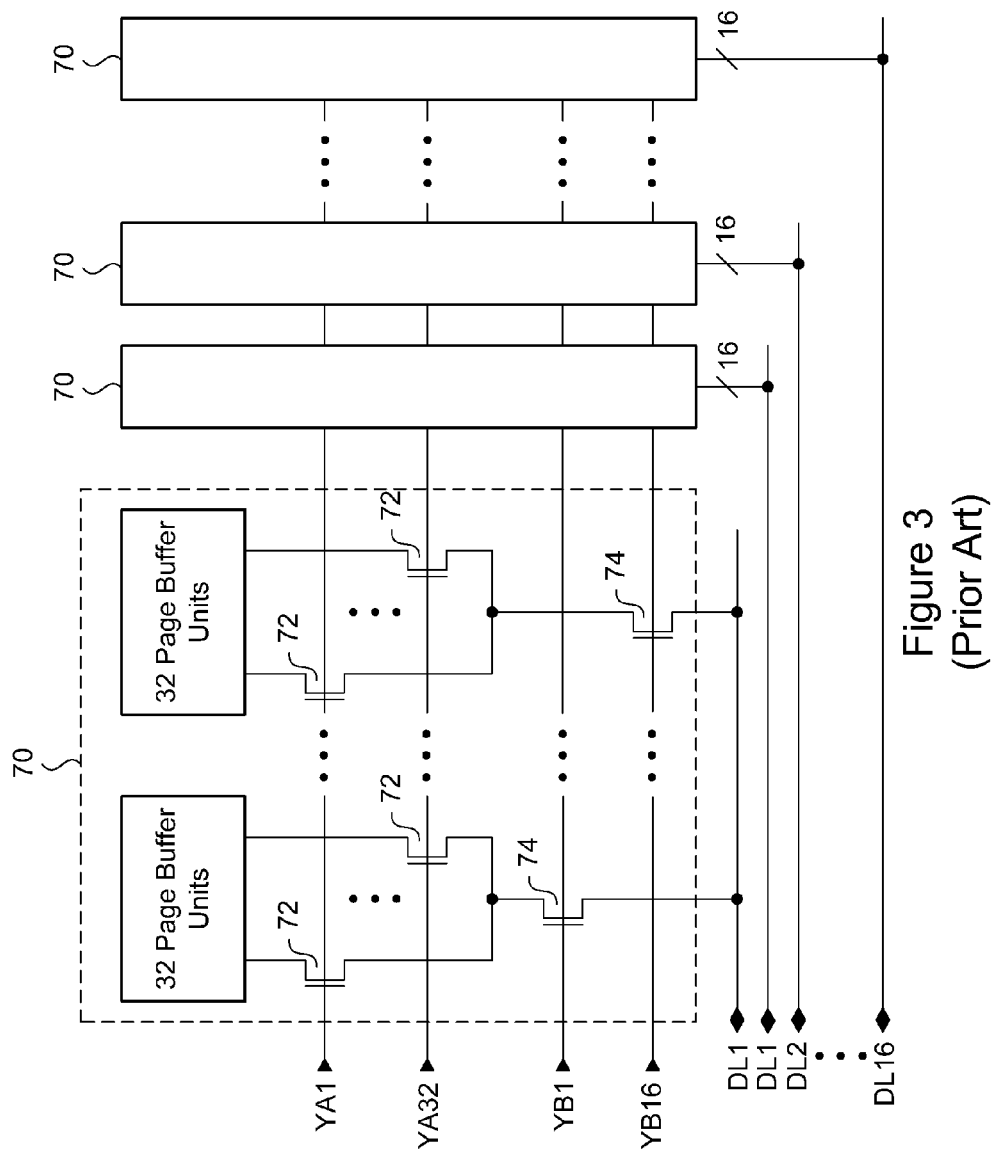
FIG. 3 is a circuit schematic showing a column decoding scheme used with the amplifier and page buffer circuit block shown in FIG. 2.

As previously mentioned, minimized circuit area consumption of the pitch limited circuits will result in a reduced area of the memory bank. In the present embodiments, this is achieved by sharing one page buffer with both adjacent sectors 202 and 206, and by minimizing the amount of column select circuitry used for coupling the page buffer 212 to the datalines L_DL[1:n]. While the previously proposed column decoding scheme shown in FIG. 3 can be used to couple the data from the page buffer 212 of FIG. 5 or 7A to the datalines L_DL[1:n], the plurality of first and second stage pass transistors will require valuable circuit area. To further minimize circuit area, a self-decoding column select circuit is used for coupling data from each page segment of sectors 202 and 206 to the datalines L_DL[1:n].

Figure 10:
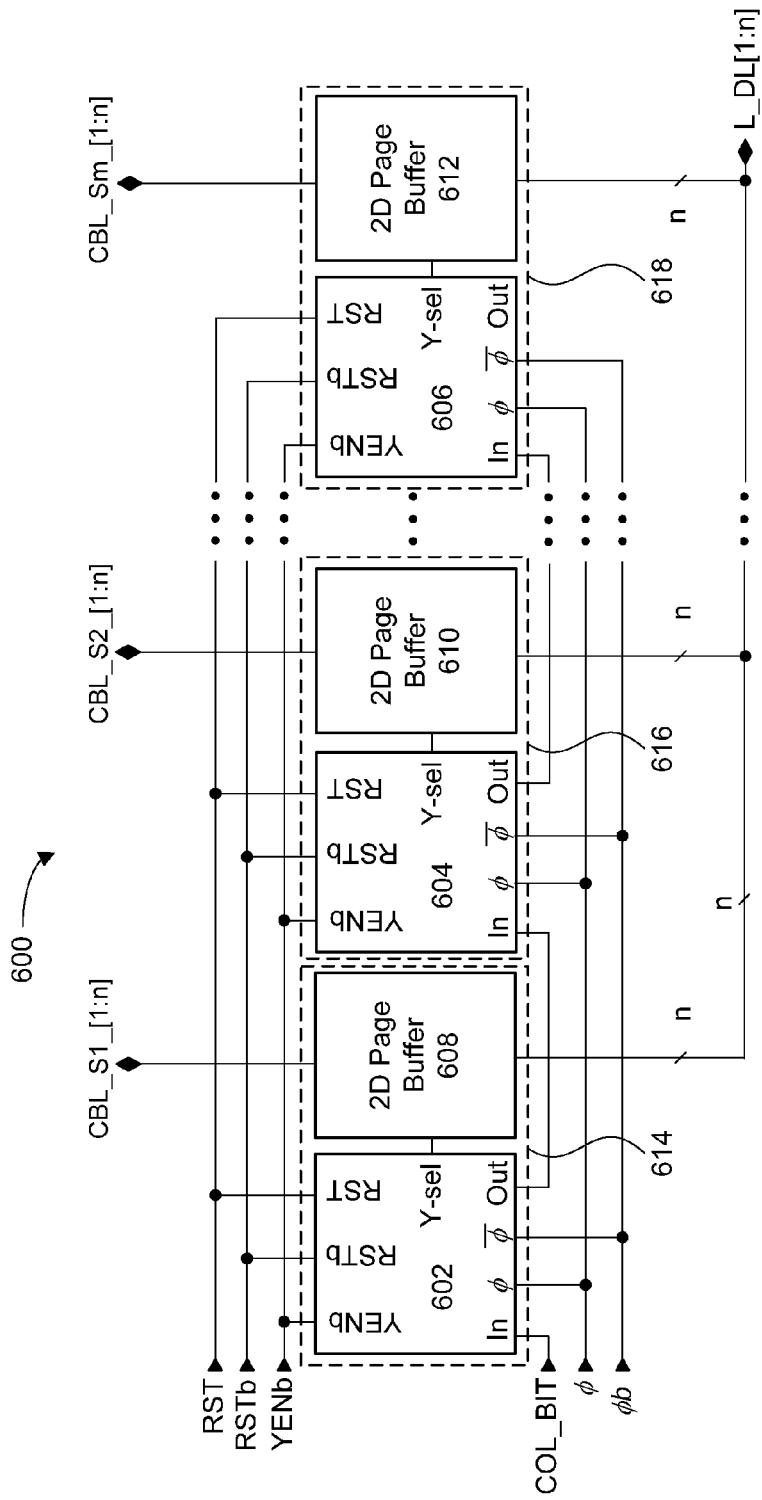
FIG. 10 is a block diagram showing a self-decoding column select circuit, according to an embodiment of the present invention.

FIG. 10 is a block diagram showing a functional implementation of a self-decoding column select circuit integrated into a page buffer circuit, according to an embodiment of the present invention. Self-decoding page buffer 600 can be used in place of both page buffers 212 and 214 in FIG. 5 and page buffer 212 in FIG. 7. Self-decoding page buffer 600 will sequentially couple data from each segment stored in page buffer 212 to the datalines L_DL[1:n], in response to a single column select bit COL_BIT that is shifted through the self-decoding page buffer 600. The self-decoding page buffer 600 includes several page buffer stages 614, 616 and 618, of which only three are shown in FIG. 10. As shown in FIG. 10, the page buffer stages 614, 616 and 618 include sequential enablers 602, 604 and 606, and segment page buffers 608, 610 and 612. Accordingly, each sequential enabler is paired with one segment page buffer for controlling the segment page buffer. For example, sequential enabler 602 is paired with segment page buffer 608. In the embodiment of FIG. 10, it is assumed that there are up to m page segments (400 and 402) in sectors 202 and 206 of FIG. 7A, and therefore there are m corresponding self-decoding page buffer stages, of which only the first, second and last self-decoding page buffer stages of self-decoding page buffer 600 are shown. The variable m can be any integer value greater than 0, and is selected based on the memory array architecture.

Each self-decoding page buffer stage is responsible for coupling its common bitlines to datalines L_DL[1:n]. Accordingly, segment page buffer 608 couples common bitlines CBL_S1_[1:n] of the first segment to L_DL[1:n], segment page buffer 610 couples common bitlines CBL_S2[1:n] of the second segment to L_DL[1:n], and segment page buffer 612 couples common bitlines CBL_Sm_[0:n] of the mth (last) segment to L_DL[1:n]. Each segment page buffer is controlled by its respective sequential enabler, and each sequential enabler will be enabled to couple its common bitlines to L_DL[1:n] when the single column select bit COL_BIT is received.

In the present embodiment, each sequential enabler receives control signals such as complementary reset signals RST and RSTb, decode enable signal YENb, and complementary clock signals φ and φb. In their active states, signals RST, RSTb and YENb enable the sequential enabler. In the first self-decoding page buffer stage 614, the input terminal IN receives COL_BIT, which will be provided through output terminal OUT in response to clock signals φ and φb. Because each sequential enabler is connected in series to a preceding sequential enabler by connecting its input terminal IN to the output terminal OUT of the preceding sequential enabler, column select bit COL_BIT is eventually shifted from the first sequential enabler 602 to the last sequential enabler 606. Therefore, each segment page buffer will couple its common bitlines to L_DL[1:n] in sequence, in response to COL_BIT. In the present embodiment, COL_BIT is a high logic level bit, but can be a low logic level bit as well.

Figure 11:
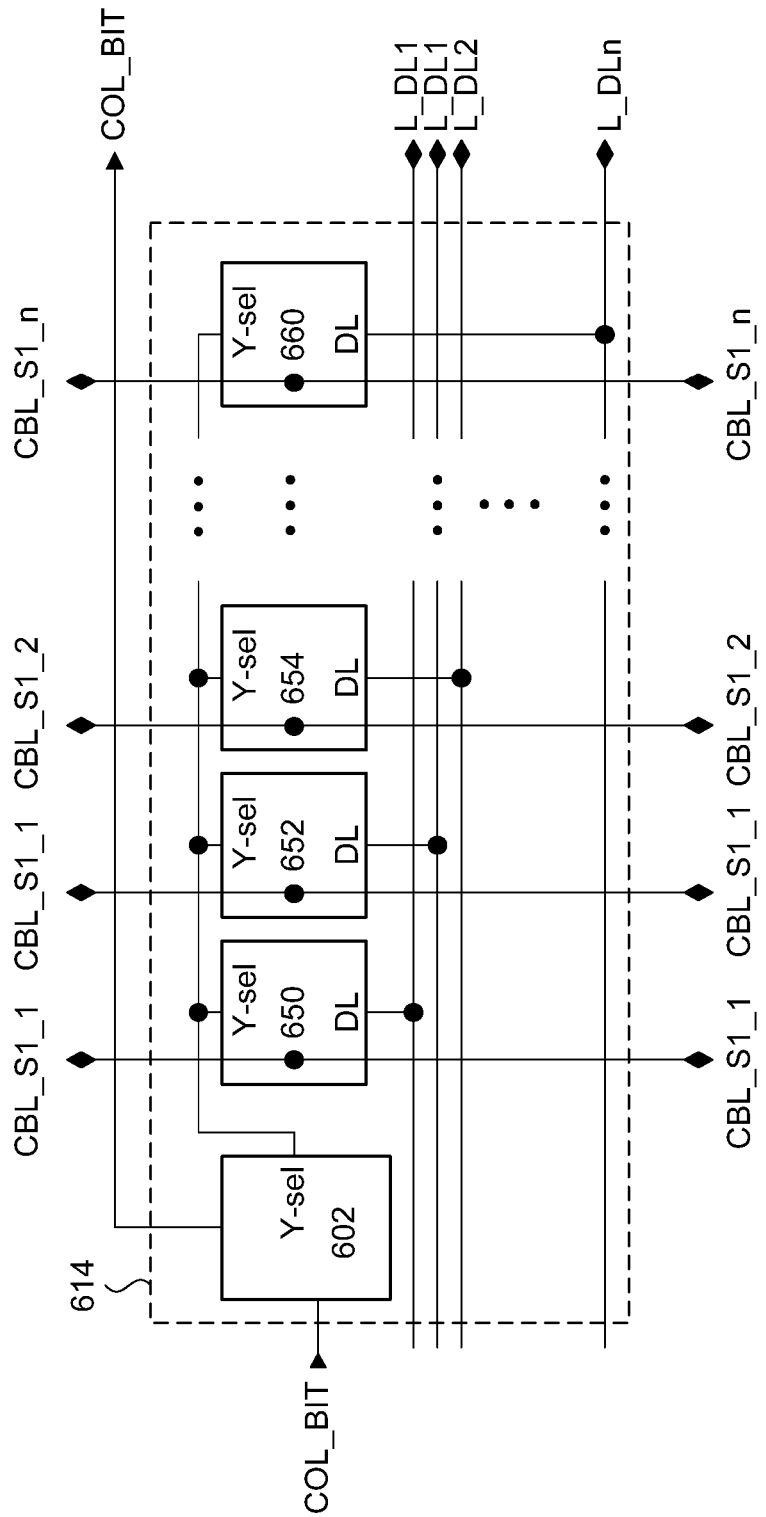
FIG. 11 is a block diagram showing the details of one self-decoding page buffer cell, according to an embodiment of the present invention.

FIG. 11 is a block diagram showing the details of one self-decoding page buffer stage, such as self-decoding page buffer stage 614 for example. The remaining self-decoding page buffers stages are identically configured. Self-decoding page buffer stage 614 includes sequential enabler 602 shown in FIG. 10, and page buffer units 650, 652, 654 and 660. In the present example, page buffer unit 660 is the last page buffer unit in page buffer stage 614. Sequential enabler 602 is a simplified block diagram that omits the control signals in order to simplify the diagram. There are a total of n page buffer units, where each couples one common bitline to one dataline. For example, page buffer unit 650 couples CBL_S1_1 to L_DL1. All page buffer units are enabled to electrically couple their common bitline to a respective dataline in response to an active column enable signal Y-SEL. Y-SEL is driven to the active logic level by sequential enabler 602 in response to COL_BIT, which will be subsequently passed on to the next sequential enabler in response to the clock signals φ and φb (not shown).

Figure 12:
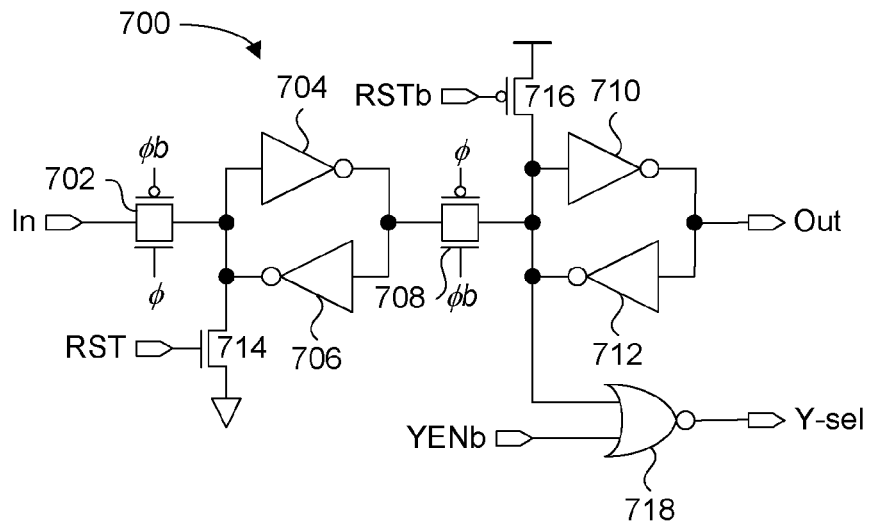
FIG. 12 is a circuit schematic of a sequential enabler in the self-decoding page buffer cell of FIG. 11, according to an embodiment of the present invention.

FIG. 12 is a circuit schematic of the sequential enabler 602 of FIGS. 10 and 11. In the present embodiment all sequential enablers are identical in configuration. Each sequential enabler is implemented as a master/slave flip-flop 700. Master/slave flip-flop 700 includes a first transmission gate 702, a pair of cross-coupled inverters 704 and 706, a second transmission gate 708, a second pair of cross-coupled inverters 710 and 712, first and second reset devices 714 and 716, and a NOR logic gate 718. Master/slave flip-flop 700 is enabled when control signals RST, RSTb and YENb are at the high, low and low logic levels, respectively. When disabled, OUT and Y-sel will be at the low logic level as reset devices 714 and 716 will be turned on and at least one input to NOR logic gate 718 will be at the high logic level. These control signals can be controlled by the command decoder or other similar logic, and synchronized to ensure that read data is properly applied to the datalines and program data is properly applied to the common bitlines.

First transmission gate 702 passes a received signal, such as COL_BIT, on input terminal IN when clock signals φ and φb are at the high and low logic levels respectively. Cross coupled inverters 704 and 706 will latch the signal and pass it to the second pair of cross-coupled inverters 710 and 712 via second transmission gate 708 when φ and φb have switched to the low and high logic levels respectively. The inverted state of the input signal (COL_BIT) is received by NOR logic gate 718, which is then inverted again by enabled NOR logic gate 718 to drive Y-sel to the high logic level. Output terminal OUT will pass COL_BIT to the next master/slave flip-flop at substantially the same time that Y-sel is driven to the active high logic level. It is noted, however, that the next master/slave flip-flop will latch COL_BIT when clock signal $\phi$ is at the high logic level.

Figure 13:
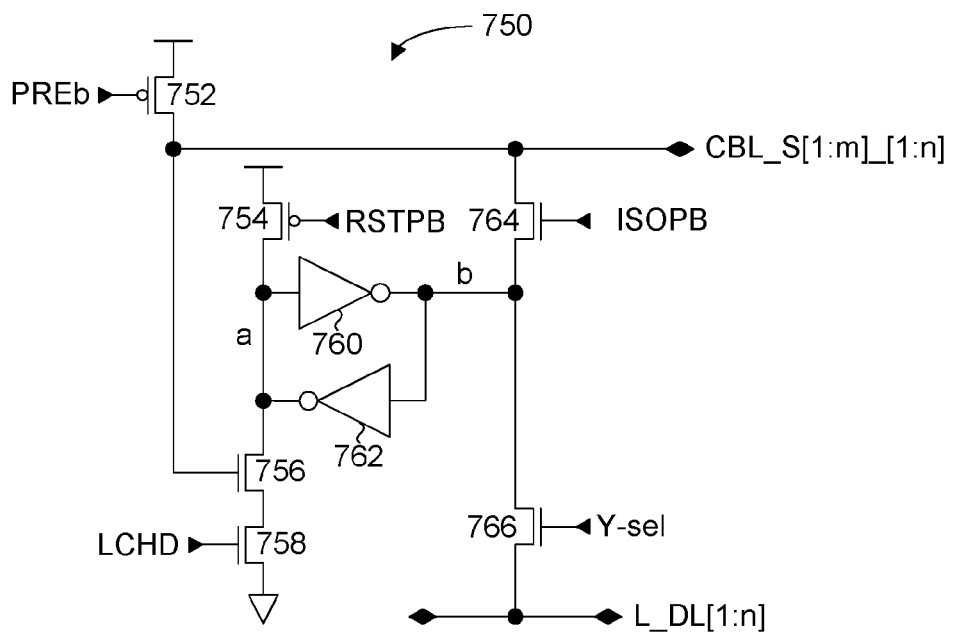
FIG. 13 is a circuit schematic of a page buffer unit in the self-decoding page buffer cell of FIG. 11, according to an embodiment of the present invention.

FIG. 13 is a circuit schematic of a page buffer unit, such as page buffer unit 650 shown in FIG. 11. Referring to FIGS. 11 to 13, all page buffer units are identically configured. Page buffer unit 750 includes a precharge circuit, a sense circuit and a dataline coupling circuit. The precharge circuit includes a precharge device 752 for precharging the common bitline CBL_S[1:m][1:n] to VDD in response to precharge signal PREb. The sense circuit includes a latch reset device 754, a latch sense enable device 756, and a latch enable device 758 connected in series between VDD and VSS, and cross-coupled inverters 760 and 762. Latch reset device 754 is controlled by latch reset signal RSTPB for resetting the latched state of cross-coupled inverters 760 and 762. Latch enable device 758 is controlled by latch enable signal LCHD for enabling sensing of the current on the common bitline CBL_S[1:m][1:n]. Cross-coupled inverters 760 and 762 have a first common node "a" connected to the shared terminals of latch reset device 754 and latch sense enable device 756, and a second common node "b" coupled to the dataline coupling circuit. The dataline coupling circuit includes a bitline isolation device 764 and a column select device 766 connected in series between common bitline CBL_S[1:m][1:n] and dataline L_DL[1:n], having common node "b" at the shared terminals of devices 764 and 766. Bitline isolation device 764 is controlled by signal ISOPB while column select device 766 is controlled by column select signal Y-sel. Signals PREb, RSTPB, ISOPB and LCHD can be generated from the control block 106 of FIG. 4A.

The operation of page buffer unit 650 during a read operation is now described. While latch enable signal LCHD is at the inactive low logic level, signal RSTPB is driven to the low logic level to reset cross-coupled inverters 760 and 762 such that node "b" is set to the low logic level. Accordingly, node "a" is at the high logic level during this reset state. The common bitline CBL_S[1:m][1:n] is precharged to VDD by driving PREb to the low logic level, thereby turning on precharge device 752. After a wordline is activated and the selected bitline is coupled to CBL_S[1:m][1:n], ISOPB is driven to the high logic level and signal LCHD will be driven to the high logic level to enable sensing of the voltage on CBL_S[1:m][1:n]. If the selected memory cell is unprogrammed, then the VDD precharge level of CBL_S[1:m][1:n] will flip node "b". On the other hand, if the selected memory cells is programmed, then the VDD precharge level of CBL_S[1:m][1:n] will discharge towards VSS. When the sensing period is ended, LCHD returns to the low logic level, and Y-sel is eventually driven to the high logic level to couple the latched data to L_DL[1:n].

The operation of page buffer unit 650 during a program operation is now described. In a program operation, latch enable signal LCHD is not used and remains at the inactive low logic level, while signal RSTPB is driven to the low logic level to reset cross-coupled inverters 760 and 762 such that node "b" is set to the low logic level. The common bitline CBL_S[1:m][1:n] is precharged to VDD by driving PREb to the low logic level, thereby turning on precharge device 752. Program data is driven onto L_DL[1:n], and is latched by cross-coupled inverters 760 and 762 when Y-sel is driven to the high logic level. Signal ISOPB is driven to the high logic level to couple node "b" to CBL_S[1:m][1:n]. The programmed state of the memory cells coupled to the selected wordline will then depend on the logic level of node "b".

A unique feature of page buffer unit 750 is the single column select device 766 that directly couples the cross-coupled inverters 760 and 762 to L_DL[1:n]. The single column select device is simpler and occupies a smaller circuit area than the column select devices 72 and 74 of FIG. 3. Accordingly, a single corresponding Y-sel signal, generated by a corresponding sequential enabler such as sequential enabler 602, is all that is needed for coupling L_DL[1:n] to node "b". The previous description of the operation of the page buffer unit 650 during read and program operations are example operations, and those skilled in the art will understand that the same circuit can be operated with variations in signal activation sequences. The page buffer unit 650 can be implemented with alternate circuit configurations that perform sensing and latching functionality for read data, and latching functionality for program data.

Figure 14:
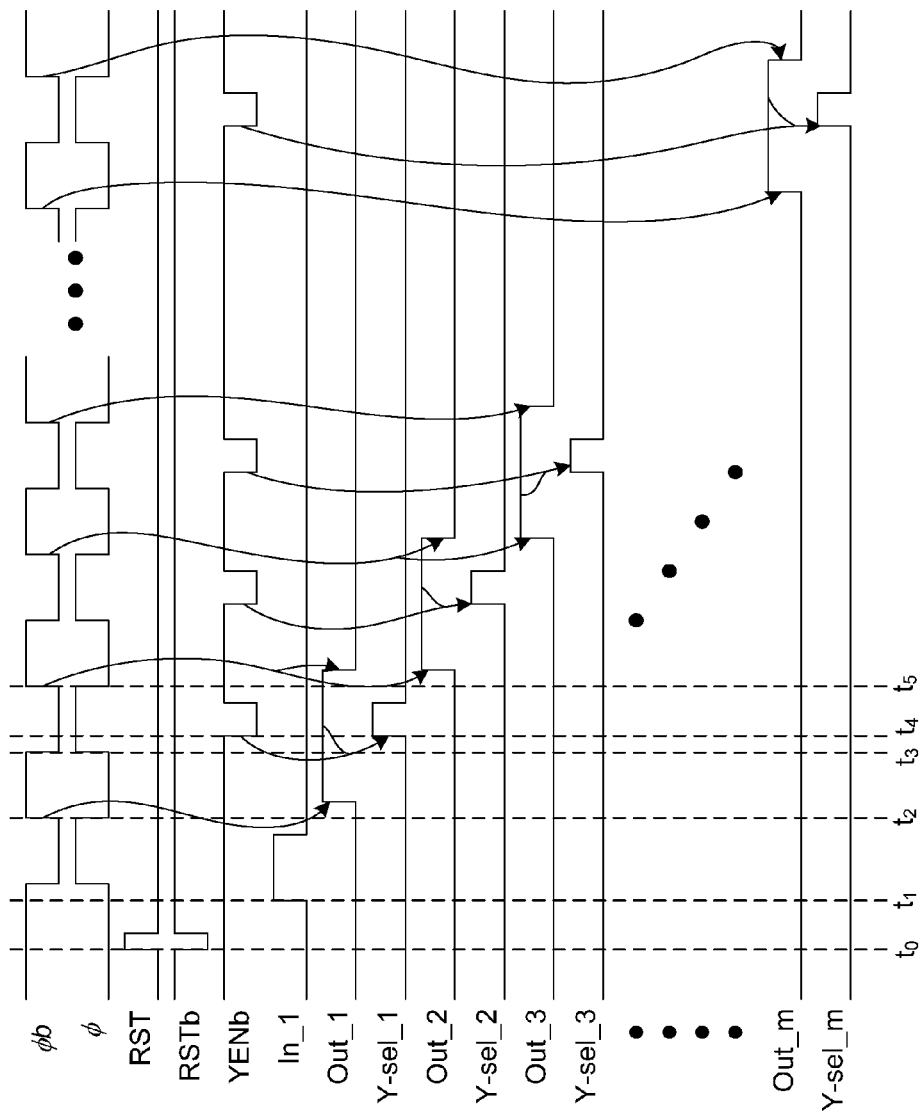
FIG. 14 is a sequence diagram illustrating the operation of the self-decoding column select circuit of FIG. 10.

Following is a discussion of the operation of self-decoding page buffer 600 of FIG. 10, which uses the circuit embodiments shown in FIGS. 11 to 13. Reference is made to the sequence diagram shown in FIG. 14, which shows signal traces for control signals used by the sequential enabler, and signal traces of the column select bit COL_BIT as it is passed, or shifted, from one sequential enabler to a subsequent sequential enabler. The shown control signal traces include common complementary clock signals $\phi$ and $\phi b$, common complementary reset signals RST and RSTb, and common decode enable signal YENb. The signal traces for the input terminal "In", the output terminal "Out" and the Y-sel output of a first sequential enabler are shown, as are the signal traces for the output terminal "Out" and the Y-sel output for subsequent sequential enablers. In FIG. 14, the signals associated with the first, second and third sequential enablers are appended with the numbers 1, 2 and 3 respectively, while the last (mth) sequential enabler has its associated signals appended with the letter m.

Starting at time $t_0$, reset signal RST is pulsed to the high logic level while complementary signal RSTb is pulsed to the low logic level to reset all the sequential enablers. In the present embodiment, RST and RSTb are pulsed on a rising edge of clock signal $\phi$. As shown in the example sequential enabler circuit implementation of FIG. 12, the latch consisting of inverters 704 and 706 has its input side coupled to VSS while the latch consisting of inverters 710 and 712 has its input side coupled to VDD, in response to the complementary reset signal pulses. Although the reset signal pulses are short in duration, transmission gate 708 is open while clock signal $\phi$ is at the high logic level. Therefore the two latch circuits drive each other to the reset states. Decode enable signal YENb remains at the inactive high logic level to maintain Y-sel at the low logic level.

Following at time $t_1$, the input terminal In_1 of the first sequential enabler 1 is pulsed to the high logic level, which corresponds to the application of column select bit COL_BIT. COL_BIT is latched by inverters 704 and 706 when $\phi$ is at the high logic level. At time $t_2$, $\phi$ transitions to the low logic level to shift COL_BIT to inverters 710 and 712 to drive output terminal "Out" to the high logic level. At time $t_3$, clock signal $\phi$ transitions to the low logic level and COL_BIT appearing on Out_1 will be latched by the sequential enabler 2, since its In_2 input terminal is connected to Out_0. The signal trace for In_2 and the subsequent sequential enablers are not shown in order to simplify the sequence diagram. It is noted that at time $t_3$, input terminal "In_1" is held at the low logic level since each sequential enabler will receive COL_BIT only once per decode cycle, where one decode cycle ends after the last common bitline is coupled to the dataline. In the example of FIG. 10 this can be CBL_Sm_n. This means that for subsequent transitions of clock signal φ, a low logic signal will be latched by both latch circuits of the sequential enabler. In other words, an inactive low logic level COL_BIT is received by the sequential enabler 2.

Returning to the first sequential enabler 1, YENb is pulsed to the low logic level at time $t_4$ to enable NOR logic gate 718, which then drives Y-Sel_1 to the high logic level for the same approximate duration that YENb is at the low logic level. When Y-Sel_1 is at the high logic level, column select device 766 of page buffer unit 750 will be turned on to couple its corresponding common bitline to a dataline. At time $t_5$, clock signal φ transitions to the low logic level, causing output terminal Out_2 of sequential enabler 2 to be driven to the high logic level. As previously remarked, sequential enabler 2 had received COL_BIT at time $t_3$. At substantially the same time, output terminal Out_1 of sequential enabler 1 falls to the low logic level as it had latched the inactive COL_BIT signal. Subsequently, Y-Sel_2 will be pulsed to the high logic level in response to low logic level pulse of YENb. This process repeats until the last sequential enabler pulses Y-Sel_m to the high logic level.

In the embodiment shown in FIG. 5, Y-Sel_m is the last column select signal of page buffer 212 to be enabled. If the same logical wordline is driven in Sector 208, then the output terminal Out_m can be coupled to the first sequential enabler in page buffer 214, where the sequential activation of column select signals would continue. Those skilled in the art will understand that parallel/serial data conversion selector 216 is controlled to serialize the data from R_DL[1:n] instead of L_DL[1:n]. Therefore, by activating the column enable signals (Y-Sel_[1:m]) in sequence, all the bits of data associated with a selected wordline can either be read from it or programmed to it. More specifically, as each Y-Sel signal is activated, sets of nbits of data are iteratively provided onto datalines L_DL[1:n], and then subsequently serialized by parallel/serial data conversion selector 216 as GLOB_DATA. Those skilled in the art will understand that counter 306 of FIG. 6 should complete the serialization of the datalines L_DL[1:n] (or R_DL[1:n]) within one period of clock signal φ, hence the selection of the frequencies governing the operation of these circuits will be selected to ensure proper operation of the circuits.

While the example embodiments of the page buffer shown in FIGS. 7A to 13 shows their implementations in the serial data path core architecture, it is noted that they can be used in illustrated Flash memory architectures that do not employ a serial data path core architecture. For example, the standard Flash memory array can be designed to be divided into top and bottom halves, analogous to the sectors shown in the figures, and the page buffer of the presented embodiments positioned in between. Column selection devices and decoding circuitry for multiplexing the top bitlines and bottom bitlines to common bitlines can be implemented in the manner shown and described in the present embodiments. While each self-decoding page buffer cell of the 2D page buffer shown in FIGS. 10 and 11 include a sequential enabler for providing a Y-sel signal for the page buffer unit, any address decoded signal can be used instead. The specific decoding configuration will depend on the selected data output architecture being implemented. For example, a grouping of successive page buffer units can receive the same address decoded Y-sel signal, or each page buffer unit of a grouping receives a different address decoded Y-sel signal.

The previous discussion illustrates direct bank to serial data path operation, such as memory bank 104 and serial data path 102 of FIG. 4A. According to another embodiment of the present invention, the serial core memory system 100 includes two memory banks both accessible by the serial data path 102. With reference to FIG. 5 for example, the single memory bank 200 would be replaced by two identically configured memory banks. Naturally, two memory banks will increase the density of the memory device, and according to another embodiment of the present invention, both memory banks can be coupled to each other to realize direct bank-to-bank data transfers. Bank-to-bank transfers are ideally suited for advanced operations such as wear leveling control, where data can be copied to the other memory bank if the finite program/erase cycles for a portion of the current memory bank is about to be reached. Otherwise, in the worst case scenario, the data would have to be read out from one bank through the serial data path 102 and back to the memory controller, which then sends the data back to the other bank of the same memory device. Those skilled in the art will understand that this sequence of operations will impact performance of the memory system. Wear leveling control is just an example of one operation that can take advantage direct memory bank transfers, but any operation where data is moved or copied from one bank to another will benefit from a direct bank to bank transfer architecture.

Figure 15:
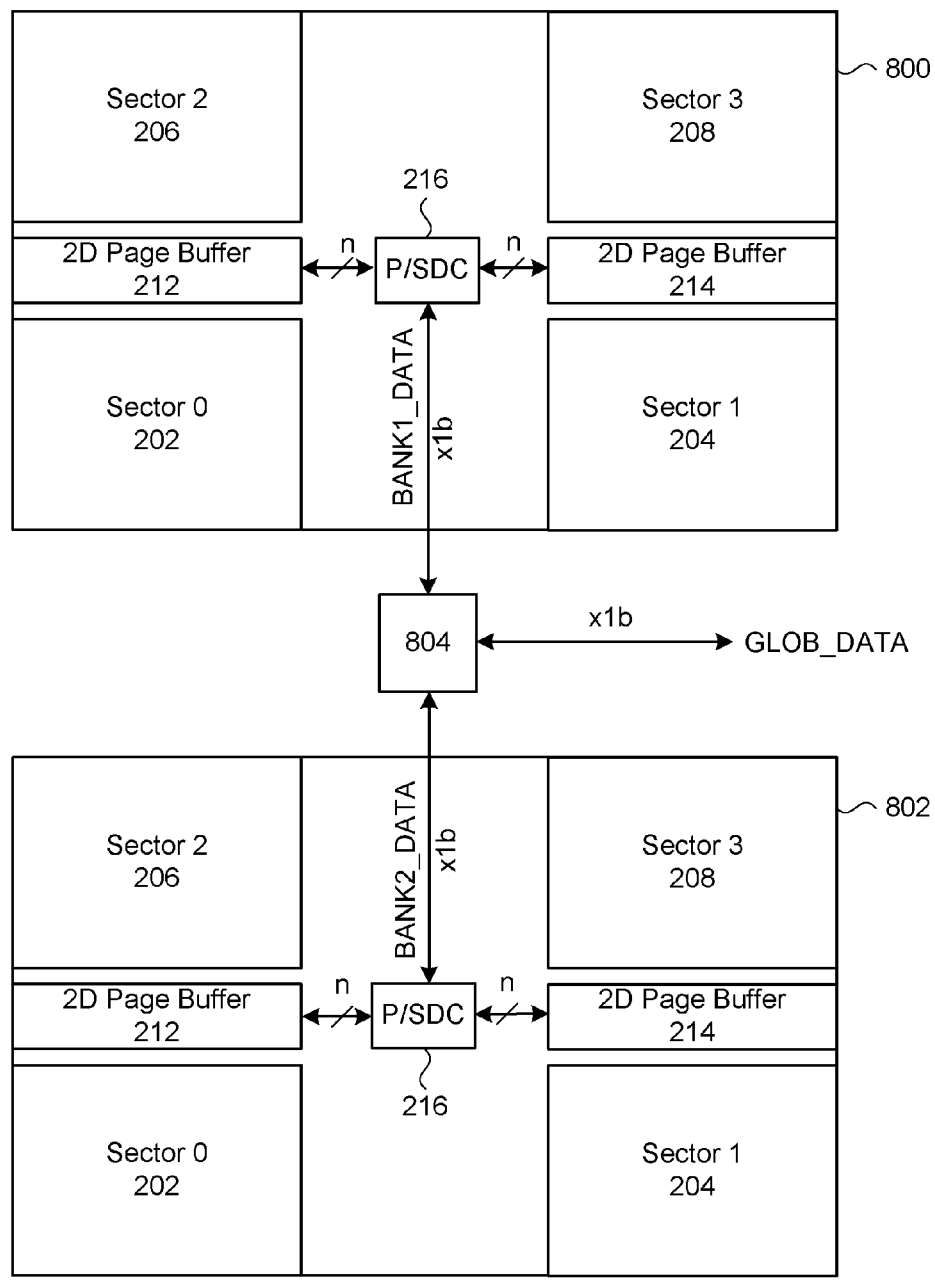
FIG. 15 is a block diagram illustrating a two bank configuration having a serial core architecture, according to an embodiment of the present invention.

FIG. 15 is a block diagram showing a direct bank to bank transfer architecture according to an embodiment of the invention. The present embodiment includes two identically configured memory banks 800 and 802, and a serial transfer switch 804. In the example of FIG. 15, memory banks 800 and 802 are identical in configuration as memory bank 200 of FIG. 5, and as such, includes the same features that have been previously described. Memory bank 800 provides and receives serial data via a serial data signal called BANK1_DATA while memory bank 802 provides and receives serial data via a serial data signal called BANK2_DATA. BANK1_DATA and BANK2_DATA are coupled to serial transfer switch 804, which selectively couples one of the two to GLOB_DATA depending on which memory bank is being accessed for a read or a program operation. GLOB_DATA is analogous to the same named signal in FIG. 5, which is coupled to a serial data path, such as serial data path 102 of FIG. 5. While signal GLOB_DATA is considered a serial global data signal that is coupled to the serial data path of a memory device, such as serial data path 102 of FIG. 4A, serial data signals BANK1_DATA and BANK2_DATA are considered local serial data signals.

The operation of serial transfer switch 804 described above is called a normal mode of operation. In a direct transfer mode of operation, BANK1_DATA and BANK2_DATA are directly coupled to each other. Accordingly, in the direct transfer mode of operation, the page buffers of memory bank 800 and 802 will be synchronized such that data provided from the page buffers of one memory bank are latched in the page buffers of the other memory bank. For example, the same clock signals used by the sequential enabler 700 of FIG. 12 can be shared between memory banks 800 and 802, and the CLK signal used in parallel/serial data conversion selector 216 of FIG. 6 can be shared between memory banks 800 and 802.

Figure 16:
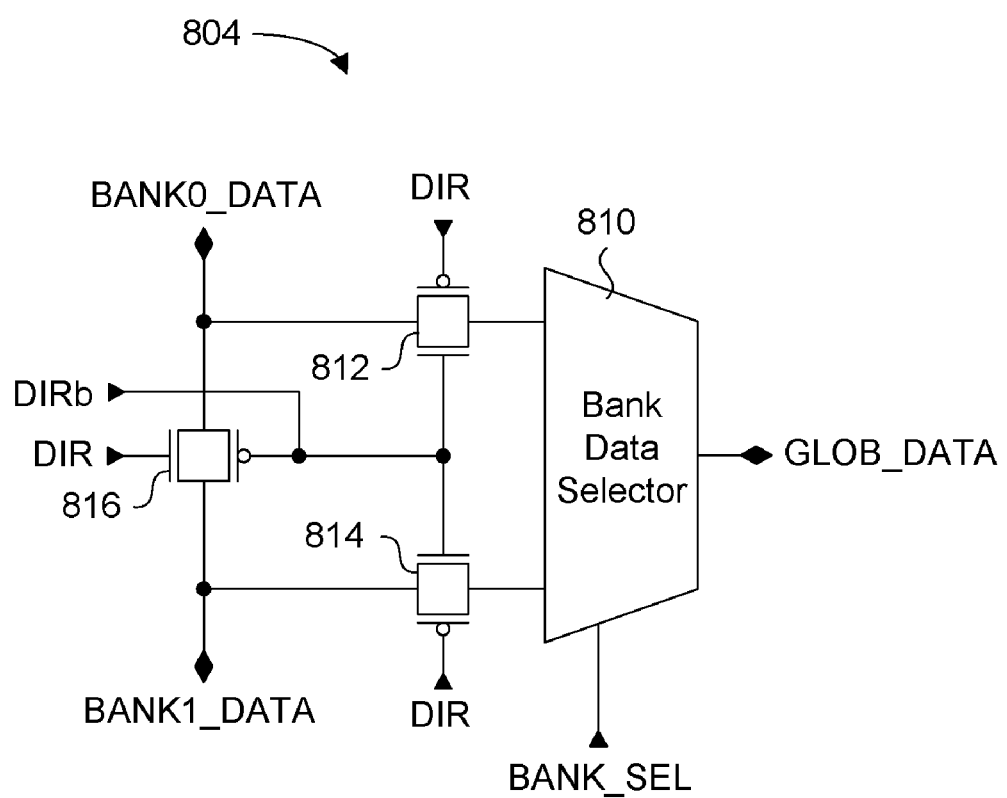
FIG. 16 is a circuit schematic of the serial transfer switch shown in FIG. 15, according to an embodiment of the present invention; and, FIG. 17 is a block diagram of a multi-bank serial core memory system having two independent serial data paths, according to an embodiment of the present invention.

FIG. 16 is a circuit schematic of serial transfer switch 804 of FIG. 15, according to one embodiment. Serial transfer switch 804 includes a data bank selector 810, and transmission gates 812, 814 and 816. Transmission gate 812 couples BANK1_DATA to a first terminal of data bank selector 810, while transmission gate 814 couples BANK2_DATA to a second terminal of data bank selector 810. Both transmission gates 812 and 814 are turned on when complementary signals DIR and DIRb are at the inactive low and high logic levels respectively. Transmission gate 816 couples BANK1_DATA and BANK2_DATA directly to each other when DIR and DIRb are at the active high and low logic levels respectively. Data bank selector 810 is controlled by selection signal BANK_SEL, to couple either BANK1_DATA or BANK2_DATA to GLOB_DATA. The circuit of serial transfer switch 804 is an example of one circuit implementation, and other known circuits can be used to achieve the same functionality. For example, data bank selector 810 can be implemented with a multiplexor/demultiplexor circuit that is well known in the art. Signals DIR and DIRb can be generated by the control block 106 of the memory device of FIG. 4A in response to a specific command.

The direct bank to bank transfer architecture is scalable to include more than two memory banks. For example, pairs of memory banks as configured in FIG. 15 can be linked together with another serial transfer switch positioned between the two pairs to couple the final GLOB_DATA signal to the serial data path. Accordingly, the memory bank configuration shown in FIG. 15 can replace the single memory bank 104 of FIG. 4A.

The serial core memory system 100 of FIG. 4A is an example of a memory device having a single serial data path for interfacing with other memory devices. U.S. Patent Publication No. 20070076479 describes a high performance memory system which can execute substantially concurrent operations as it includes a two separate serial interface circuits. This principle can be applied to the serial core memory system 100 of FIG. 4A to realize a high density and high performance memory system with a direct bank to bank transfer architecture.

Figure 17:
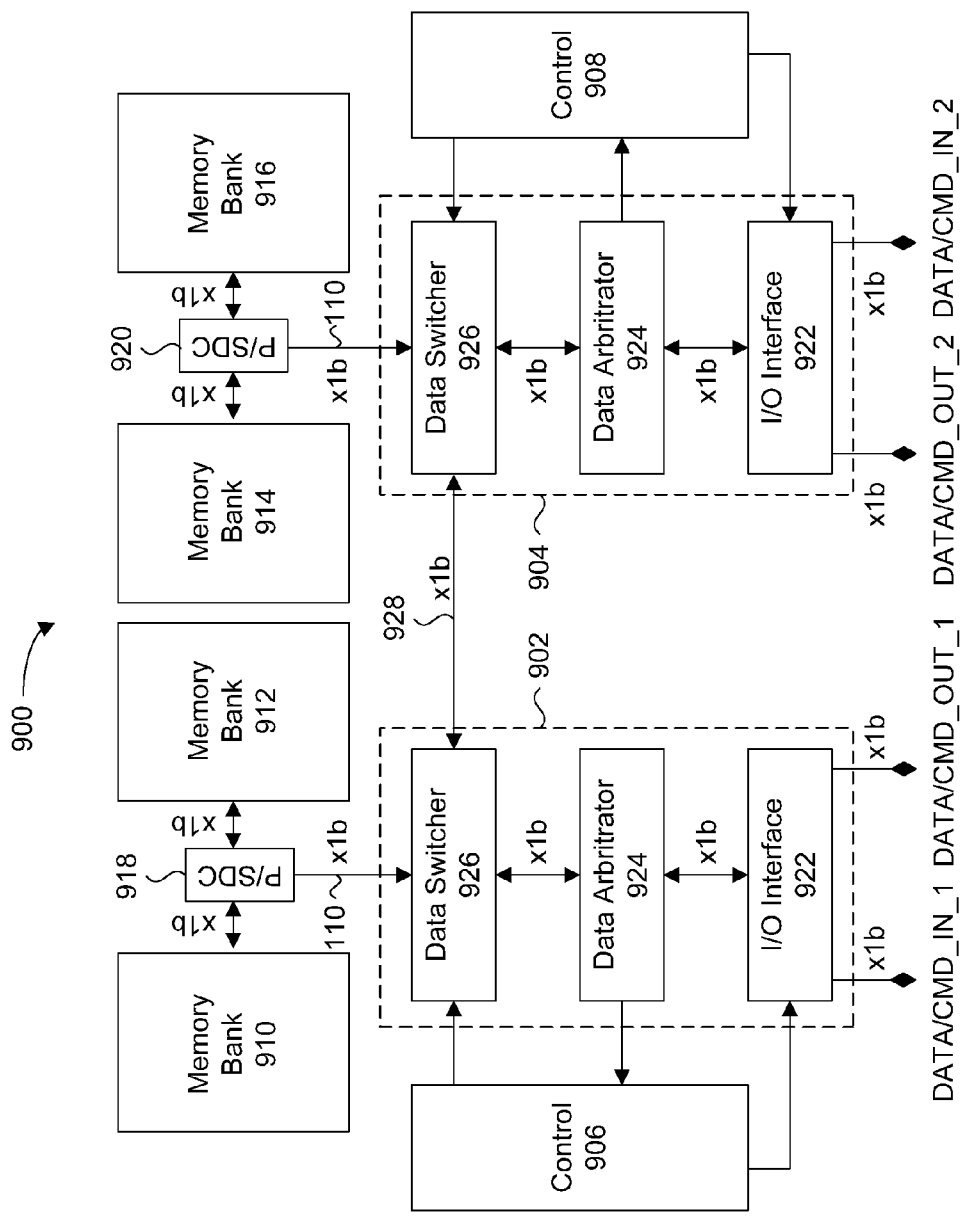

FIG. 17 is a block diagram of a multi-bank serial core memory system having two independent serial data paths. Memory system 900 includes a first serial data path 902, a second serial data path 904, control blocks 906 and 908, and memory banks 910, 912, 914 and 916. Located between memory banks 910 and 912 is a first serial transfer switch 918. Located between memory banks 914 and 916 is a second serial transfer switch 920. The first and second serial data paths 902 and 904 correspond to the serial data path 10 shown in FIG. 4A, while the control blocks 906 and 908 correspond to the control block 106 shown in FIG. 4A. The high voltage generator shown in FIG. 4A is omitted to simplify the schematic, however those skilled in the art will understand that a high voltage generator and other circuits will be required to enable proper functionality of the system. The first serial data path 902 receives DATA/CMD_IN_1 and provides DATA/CMD_OUT_1 while second serial data path 904 receives DATA/CMD_IN_2 and provides DATA/CMD_OUT_2. Each of the first and second serial data paths 902 and 904 includes a serial I/O interface 922, a data arbitrator 924, and a data switcher 926. All these circuits have been previously described, as have their functions.

Generally, circuit blocks 902, 906, 910, 912 and 918 operate as a single unit, while circuit blocks 904, 908, 914, 916 and 920 operate as another single unit. This means that operations can be executed in either unit independently of the other, and concurrently with each other. The presence of data switchers 926 in both serial data paths 902 and 904 now permits the serial data paths to access every memory bank. As shown in FIG. 17, there is a single bit direct transfer line 928 coupled between data switchers 926. Therefore, memory banks 910 and 912 can be coupled to serial data path 904 while memory banks 914 and 916 can be coupled to serial data path 902. Furthermore, data from memory banks 910 and 912 can be directly transferred to memory banks 914 and 916, and vice versa, through the direct transfer line 928.

Direct memory transfer operations are advantageous, since the data does not need to be read out of the memory device before being reprogrammed to a different bank of the same memory device. For example, page copy or block copy operations can be efficiently executed because as data corresponding to one page is read from a source bank, the data is loaded into the target bank at substantially the same time.

Therefore, there are several different circuits of the serial core memory system that will minimize circuit area consumption while improving performance relative to memory devices employing a traditional parallel data path core. First is the self-decoding column select circuit for quickly transferring data from the bitlines to datalines. Second is the shared page buffer which is coupled to two sectors of a memory array. Third is the serial data path for coupling a serial bitstream of data between external input/output interface pins and at least one memory bank 104 of FIG. 4A. Fourth are the serial transfer switches and data switches that couple memory banks to each other or to different serial data paths. Since data is transferred between the external input/output pins and the memory sectors in serial format, and only converted to parallel format within the memory bank, significant circuit area is conserved. This is because only single bi-directional serial data lines, such as direct transfer line 928, bidirectional serial data lines 110 and the serial data paths 902 and 904 are used for transporting the data serially instead of with a plurality of parallel data lines.

The previously described embodiments of the serial core memory system can be implemented in discrete memory devices, or can be embedded in a system on chip (SOC) or system in package (SIP) device. In a discrete memory device implementation, multiple memory devices having the above described serial core memory system embodiments can be used in the serial interconnection 5 of FIG. 1A. A single packaged device implemented as an SOC can have multiple instances of the memory system connected serially in the same configuration shown in FIG. 1A. A single packaged device implemented as an SIP can have multiple chips connected serially in the same configuration shown in FIG. 1A.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

In the above-described embodiments, the operation has been described based on the active "high" signals for the purpose of simplicity. They may be designed to perform the operation based on the "low" active signals, in accordance with a design preference.

In the embodiments described above, the device elements and circuits are coupled or connected to each other as shown in the figures, for the sake of simplicity. In practical applications of the present invention to apparatus, devices, elements, circuits, etc. may be coupled or connected directly to each other. As well, devices, elements, circuits etc. may be coupled or connected indirectly to each other through other devices, elements, circuits, interfaces, etc., necessary for operation of the apparatus. Thus, in actual configuration, the circuit elements and devices are directly or indirectly coupled with or connected to each other.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A memory system comprising:
  a memory bank having
    a first bank half coupled to first n parallel datalines where n is an integer value greater than 0, the first bank half including
      a first sector having wordlines and bitlines coupled to memory cells,
      a second sector having wordlines and bitlines coupled to memory cells, and
      a page buffer selectively coupled to bitlines of one of the first sector and the second sector, the page buffer being coupled to the first n parallel datalines
    a second bank half coupled to second n parallel datalines, and
    a data converter
      for selectively converting one of the first and the second n parallel datalines into serial bitstream read data and
      for selectively converting serial bitstream write data into parallel data for one of the first and the second n parallel datalines, the memory bank
        providing the serial bitstream read data in response to a read operation and
        for receiving the serial bitstream write data in response to a write operation
  and,
  a serial data path for coupling the serial bitstream read data and the serial bitstream write data between the memory bank and input/output ports.

2. The memory system of claim 1, wherein the serial data path includes
  a data arbitrator for receiving access data serially from the input/output ports, the access data including a command and an address,
  the data arbitrator being configured
    to convert the command and the address into a parallel format, and
    to pass the serial bitstream read data to the input/output ports during the read operation.

3. The memory system of claim 1, wherein the page buffer is a first page buffer, and second bank half includes
  a third sector having wordlines and bitlines coupled to memory cells,
  a fourth sector having wordlines and bitlines coupled to memory cells, and,
  a second page buffer selectively coupled to bitlines of one of the third sector and the fourth sector, the second page buffer being coupled to the second n parallel datalines.

4. The memory system of claim 3, wherein the bitlines of the first sector and the second sector are grouped into sets of bitlines, each of the sets of bitlines being coupled to a common bitline, the common bitline being coupled to the first page buffer.

5. The memory system of claim 3, wherein the bitlines of the third sector and the fourth sector are grouped into sets of bitlines, each of the sets of bitlines being coupled to a common bitline, the common bitline being coupled to the second page buffer.

6. The memory system of claim 1, wherein the data converter includes
  a first converter for sequentially coupling each of the first n parallel datalines to a first terminal,
  a second converter for sequentially coupling each of the second n parallel datalines to a second terminal,
  a data path selector for selectively coupling one of the first terminal and the second terminal to a bidirectional serial data line.

7. The memory system of claim 6, further including
  control logic for receiving a command and an address for operating the memory bank, the data converter and the serial data path during the read operation.

8. The memory system of claim 1, further including another memory bank for providing the serial bitstream read data in response to the read operation and for receiving the serial bitstream write data in response to the write operation.

9. The memory system of claim 8, wherein the serial data path includes a data switcher
  for selectively coupling the serial bitstream write data to one of the memory bank and the another memory bank, and
  for selectively coupling the serial bitstream read data from one of the memory bank and the another memory bank to the data arbitrator of the serial data path.

10. The memory system of claim 8, further including another serial data path
  for coupling the serial bitstream read data from one of the memory bank and the another memory bank to other input/output ports, and
  for coupling the serial bitstream write data to one of the memory bank and the another memory bank.

11. The memory system of claim 10, wherein the another serial data path includes
  a second data switcher
    for selectively coupling the serial bitstream write data to one of the another memory bank and the data switcher, and
    for selectively coupling the serial bitstream read data to one of the data switcher and another data arbitrator.

12. The memory system of claim 11, further including a serial transfer dataline for coupling the data switcher to the second data switcher.

13. The memory system of claim 8, further comprising a serial transfer switch for selectively coupling the serial bitstream read data from one of the memory bank and the another memory bank to the serial data path.

14. A memory system comprising:
  a memory bank for providing serial bitstream read data in response to a read operation and for receiving serial bitstream write data in response to a write operation, the memory bank having
    a first bank half coupled to first n parallel datalines where n is an integer value greater than 0,
    a second bank half coupled to second n parallel datalines,
    a first data converter for sequentially coupling each of the first n parallel datalines to a first terminal
      in the read operation to convert parallel read data into the serial bitstream read data, and
      in the write operation to convert the serial bitstream write data into parallel write data,
    a second data converter for sequentially coupling each of the second n parallel datalines to a second terminal in the read operation to convert parallel read data into the serial bitstream read data, and in the write operation to convert the serial bitstream write data into parallel write data, a data path selector for selectively coupling one of the first terminal and the second terminal to a bidirectional serial data line, and, a serial data path for coupling either one of the serial bitstream read data and the serial bitstream write data on the bidirectional serial data line to input/output ports.

15. The memory system of claim 14, wherein the serial data path includes a data arbitrator for receiving access data serially from the input/output ports, the access data including a command and an address, the data arbitrator being configured to convert the command and the address into a parallel format, and to pass the serial bitstream read data to the input/output ports during the read operation.

16. The memory system of claim 14, wherein the first bank half includes a first sector having wordlines and bitlines coupled to memory cells, a second sector having wordlines and bitlines coupled to memory cells, and, a first page buffer selectively coupled to bitlines of one of the first sector and the second sector, the first page buffer being coupled to the first n parallel datalines.

17. The memory system of claim 16, wherein the second bank half includes a third sector having wordlines and bitlines coupled to memory cells, a fourth sector having wordlines and bitlines coupled to memory cells, and, a second page buffer selectively coupled to bitlines of one of the third sector and the fourth sector, the second page buffer being coupled to the second n parallel datalines.

18. The memory system of claim 17, wherein the bitlines of the first sector and the second sector are grouped into sets of bitlines, each of the sets of bitlines being coupled to a common bitline, the common bitline being coupled to the first page buffer.

19. The memory system of claim 17, wherein the bitlines of the third sector and the fourth sector are grouped into sets of bitlines, each of the sets of bitlines being coupled to a common bitline, the common bitline being coupled to the second page buffer.

20. The memory system of claim 14, further including control logic for receiving a command and an address for operating the memory bank, the first data converter, the second data converter and the serial data path during the read operation.

21. The memory system of claim 14, further including another memory bank for providing the serial bitstream read data in response to the read operation and for receiving the serial bitstream write data in response to the write operation.

22. The memory system of claim 21, wherein the serial data path includes a data switcher for selectively coupling the serial bitstream write data to one of the memory bank and the another memory bank, and for selectively coupling the serial bitstream read data from one of the memory bank and the another memory bank to the data arbitrator of the serial data path.

23. The memory system of claim 21, further including another serial data path for coupling the serial bitstream read data from one of the memory bank and the another memory bank to other input/output ports, and for coupling the serial bitstream write data to one of the memory bank and the another memory bank.

24. The memory system of claim 23, wherein the another serial data path includes a second data switcher for selectively coupling the serial bitstream write data to one of the another memory bank and the data switcher, and for selectively coupling the serial bitstream read data to one of the data switcher and another data arbitrator.

25. The memory system of claim 24, further including a serial transfer dataline for coupling the data switcher to the second data switcher.

26. The memory system of claim 21, further comprising a serial transfer switch for selectively coupling the serial bitstream read data from one of the memory bank and the another memory bank to the serial data path.

27. The memory system of claim 1, wherein the input/output ports are included in an input/output interface.

28. The memory system of claim 14, wherein the input/output ports are included in an input/output interface.

* * * * *

UNITED STATES PATENT AND TRADEMARK OFFICE
CERTIFICATE OF CORRECTION

| | | |
|---|---|---|
| PATENT NO. | : 7,817,470 B2 | Page 1 of 1 |
| APPLICATION NO. | : 11/944535 | |
| DATED | : October 19, 2010 | |
| INVENTOR(S) | : Jin-Ki Kim | |

It is certified that error appears in the above-identified patent and that said Letters Patent is hereby corrected as shown below:

On the title page, item (56), page 3, insert -- Samsung Electronics, "K9XXG08UXM Preliminary Flash Memory", Technical Specification, Samsung Electronics, pp. 2, May 3, 2005. --

Signed and Sealed this
Twenty-fifth Day of January, 2011

David J. Kappos
*Director of the United States Patent and Trademark Office*